United States Patent
Garcia et al.

(10) Patent No.: US 11,894,835 B2
(45) Date of Patent: Feb. 6, 2024

(54) SANDWICHED XBAR FOR THIRD HARMONIC OPERATION

(71) Applicant: Murata Manufacturing Co., Ltd., Nagaokakyo (JP)

(72) Inventors: Bryant Garcia, Burlingame, CA (US); Pintu Adhikari, West Lafayette, LA (US); Andrew Guyette, San Mateo, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 425 days.

(21) Appl. No.: 17/129,911

(22) Filed: Dec. 22, 2020

(65) Prior Publication Data

US 2022/0094334 A1    Mar. 24, 2022

Related U.S. Application Data

(60) Provisional application No. 63/109,300, filed on Nov. 3, 2020, provisional application No. 63/081,249, filed on Sep. 21, 2020.

(51) Int. Cl.
*H03H 9/205* (2006.01)
*H03H 9/02* (2006.01)
(Continued)

(52) U.S. Cl.
CPC .............. *H03H 9/205* (2013.01); *H03H 3/02* (2013.01); *H03H 9/02015* (2013.01);
(Continued)

(58) Field of Classification Search
CPC ...... H03H 9/205; H03H 9/02; H03H 9/02015; H03H 9/02157; H03H 9/02228; H03H 9/568; H03H 9/605
See application file for complete search history.

(56) References Cited

U.S. PATENT DOCUMENTS 5,446,330 A    8/1995  Eda et al.
5,552,655 A    9/1996  Stokes et al.
(Continued)

FOREIGN PATENT DOCUMENTS

WO    2016017104       2/2016
WO    2018003273 A1    1/2018

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

(Continued)

*Primary Examiner* — Samuel S Outten
(74) *Attorney, Agent, or Firm* — ARENTFOX SCHIFF LLP

(57) ABSTRACT

A filter device has a first piezoelectric plate spanning a first and second cavity of a substrate. A first and second interdigital transducer (IDT) are on a front surface of the first piezoelectric plate over the first and second cavity. A dielectric layer is formed on the first piezoelectric plate and covers the first IDT and second IDT. A second piezoelectric plate is bonded to a front surface of the dielectric layer over the first cavity and the second cavity. A second dielectric layer is formed on a front surface of the second piezoelectric plate over the first cavity but not over the second cavity. The thickness of the dielectric layer, the first piezoelectric plate and the second piezoelectric plate can be selected to tune a shunt resonator over the first cavity and a series resonator over the second cavity.

20 Claims, 15 Drawing Sheets

(51) Int. Cl.
*H03H 9/60* (2006.01)
*H03H 9/56* (2006.01)
*H03H 3/02* (2006.01)

(52) U.S. Cl.
CPC .... *H03H 9/02157* (2013.01); *H03H 9/02228* (2013.01); *H03H 9/568* (2013.01); *H03H 9/605* (2013.01)

(56) References Cited

U.S. PATENT DOCUMENTS

| | | | |
|---|---|---|---|
| 5,726,610 A | 3/1998 | Allen et al. | |
| 5,853,601 A | 12/1998 | Krishaswamy et al. | |
| 6,377,140 B1 | 4/2002 | Ehara et al. | |
| 6,516,503 B1 | 2/2003 | Ikada et al. | |
| 6,540,827 B1 | 4/2003 | Levy et al. | |
| 6,707,229 B1 | 3/2004 | Martin | |
| 6,710,514 B2 | 3/2004 | Ikada et al. | |
| 7,345,400 B2 | 3/2008 | Nakao et al. | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,728,483 B2 | 6/2010 | Tanaka | |
| 7,868,519 B2 | 1/2011 | Umeda | |
| 7,941,103 B2 | 5/2011 | Iwamoto et al. | |
| 8,278,802 B1 | 10/2012 | Lee et al. | |
| 8,294,330 B1 | 10/2012 | Abbott et al. | |
| 8,344,815 B2 | 1/2013 | Yamanaka | |
| 8,816,567 B2 | 8/2014 | Zuo et al. | |
| 8,829,766 B2 | 9/2014 | Milyutin et al. | |
| 8,932,686 B2 | 1/2015 | Hayakawa et al. | |
| 9,093,979 B2 | 7/2015 | Wang | |
| 9,130,145 B2 | 9/2015 | Martin et al. | |
| 9,219,466 B2 | 12/2015 | Meltaus et al. | |
| 9,276,557 B1 | 3/2016 | Nordquist et al. | |
| 9,369,105 B1 | 6/2016 | Li | |
| 9,425,765 B2 | 8/2016 | Rinaldi | |
| 9,525,398 B1 | 12/2016 | Olsson | |
| 9,640,750 B2 | 5/2017 | Nakanishi et al. | |
| 9,748,923 B2 | 8/2017 | Kando et al. | |
| 9,762,202 B2 | 9/2017 | Thalmayr et al. | |
| 9,780,759 B2 | 10/2017 | Kimura et al. | |
| 9,837,984 B2 | 12/2017 | Khlat et al. | |
| 9,998,088 B2 * | 6/2018 | Bhattacharjee | H03H 9/02228 |
| 10,079,414 B2 | 9/2018 | Guyette et al. | |
| 10,187,039 B2 | 1/2019 | Komatsu et al. | |
| 10,200,013 B2 | 2/2019 | Bower et al. | |
| 10,211,806 B2 | 2/2019 | Bhattacharjee | |
| 10,284,176 B1 | 5/2019 | Solal | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,644,674 B2 | 5/2020 | Takamine | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,826,462 B2 | 11/2020 | Plesski et al. | |
| 10,868,512 B2 | 12/2020 | Garcia et al. | |
| 10,917,070 B2 | 2/2021 | Plesski et al. | |
| 2002/0079986 A1 | 6/2002 | Ruby | |
| 2002/0158714 A1 | 10/2002 | Kaitila et al. | |
| 2002/0189062 A1 | 12/2002 | Lin et al. | |
| 2003/0080831 A1 | 5/2003 | Naumenko et al. | |
| 2003/0199105 A1 | 10/2003 | Kub et al. | |
| 2004/0100164 A1 | 5/2004 | Murata | |
| 2004/0261250 A1 | 12/2004 | Kadota et al. | |
| 2005/0185026 A1 | 8/2005 | Noguchi et al. | |
| 2005/0218488 A1 | 10/2005 | Matsuo | |
| 2005/0264136 A1 | 12/2005 | Tsutsumi et al. | |
| 2006/0179642 A1 | 8/2006 | Kawamura | |
| 2007/0182510 A1 | 8/2007 | Park | |
| 2007/0188047 A1 | 8/2007 | Tanaka | |
| 2007/0194863 A1 | 8/2007 | Shibata et al. | |
| 2007/0267942 A1 | 11/2007 | Matsumoto et al. | |
| 2008/0246559 A1 | 10/2008 | Ayazi | |
| 2010/0064492 A1 | 3/2010 | Tanaka | |
| 2010/0123367 A1 | 5/2010 | Tai et al. | |
| 2010/0207707 A1 * | 8/2010 | Yata | H03H 9/6483 333/195 |
| 2011/0018389 A1 | 1/2011 | Fukano et al. | |
| 2011/0018654 A1 | 1/2011 | Bradley et al. | |
| 2011/0109196 A1 | 5/2011 | Goto | |
| 2011/0278993 A1 | 11/2011 | Iwamoto | |
| 2012/0286900 A1 | 11/2012 | Kadota et al. | |
| 2013/0234805 A1 | 9/2013 | Takahashi | |
| 2013/0271238 A1 | 10/2013 | Onda | |
| 2013/0278609 A1 | 10/2013 | Stephanou et al. | |
| 2013/0321100 A1 | 12/2013 | Wang | |
| 2014/0130319 A1 | 5/2014 | Iwamoto | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0225684 A1 | 8/2014 | Kando et al. | |
| 2015/0042417 A1 | 2/2015 | Onodera et al. | |
| 2015/0319537 A1 | 11/2015 | Perois et al. | |
| 2015/0333730 A1 | 11/2015 | Meltaus | |
| 2016/0028367 A1 | 1/2016 | Shealy | |
| 2016/0182009 A1 | 6/2016 | Bhattacharjee | |
| 2017/0063332 A1 | 3/2017 | Gilbert et al. | |
| 2017/0179928 A1 | 6/2017 | Raihn et al. | |
| 2017/0214381 A1 | 7/2017 | Bhattacharjee | |
| 2017/0214387 A1 | 7/2017 | Burak et al. | |
| 2017/0222617 A1 | 8/2017 | Mizoguchi | |
| 2017/0222622 A1 | 8/2017 | Solal et al. | |
| 2017/0370791 A1 | 12/2017 | Nakamura et al. | |
| 2018/0005950 A1 | 1/2018 | Watanabe | |
| 2018/0026603 A1 | 1/2018 | Iwamoto | |
| 2018/0033952 A1 | 2/2018 | Yamamoto | |
| 2018/0062615 A1 | 3/2018 | Kato et al. | |
| 2018/0062617 A1 | 3/2018 | Yun et al. | |
| 2018/0123016 A1 | 5/2018 | Gong et al. | |
| 2018/0191322 A1 | 7/2018 | Chang et al. | |
| 2019/0068164 A1 | 2/2019 | Houlden et al. | |
| 2019/0123721 A1 | 4/2019 | Takamine | |
| 2019/0131953 A1 | 5/2019 | Gong | |
| 2019/0273480 A1 | 9/2019 | Lin | |
| 2019/0348966 A1 | 11/2019 | Campanella-Pineda | |
| 2020/0036357 A1 | 1/2020 | Mimura | |
| 2020/0235719 A1 | 7/2020 | Yantchev et al. | |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 Ghz Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

(56) References Cited

OTHER PUBLICATIONS

Naumenko et al., "Optimal orientations of Lithium Niobate for resonator SAW filters", 2003 IEEE Ultrasonics symposium—pp. 2110-2113. (Year: 2003).

Webster Dictionary Meaning of "diaphragm" Merriam Webster since 1828.

Safari et al."Piezoelectric for Transducer Applications"published by Elsevier Science Ltd., pp. 4 (Year: 2000).

Moussa et al. Review on Triggered Liposomal Drug Delivery with a Focus on Ultrasound2015, Bentham Science Publishers, pp. 16 (Year 2005).

Acoustic Properties of SolidsONDA Corporation592 Weddell Drive, Sunnyvale, CA 94089, Apr. 11, 2003, pp. 5 (Year 2003).

Bahreynl, B.Fabrication and Design of Resonant MicrodevicesAndrew William, Inc. 2018, NY (Year 2008).

Material Properties of Tibtech Innovations, © 2018 TIBTECH Innovations (Year 2018).

Buchanan "Ceramit Materials for Electronics" 3rd Edition, first published in 2004 by Marcel Dekker, Inc. pp. 496 (Year 2004). Jan. 00, 2004.

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 p. 675 (Year 2015) Jan. 00, 2015.

Zou, Jie "High-Performance Aluminum Nitride Lamb Wave Resonators for RF Front-End Technology" University of California, Berkeley, Summer 2015, pp. 63 (Year 2015) Jan. 00, 2015.

Santosh, G. , Surface acoustic wave devices on silicon using patterned and thin film ZnO, Ph.D. thesis, Feb. 2016, Indian Institute of technology Guwahati, Assam, India Feb. 2016.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

USPTO/ISA, International Search Report and Written Opinion for PCT Application No. PCT/US2020/45654 dated Oct. 29, 2020. 2020.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

* cited by examiner

DETAIL C

Note: only one of actions 610A, 610B, 610C is performed in each of three variations of the process 600.

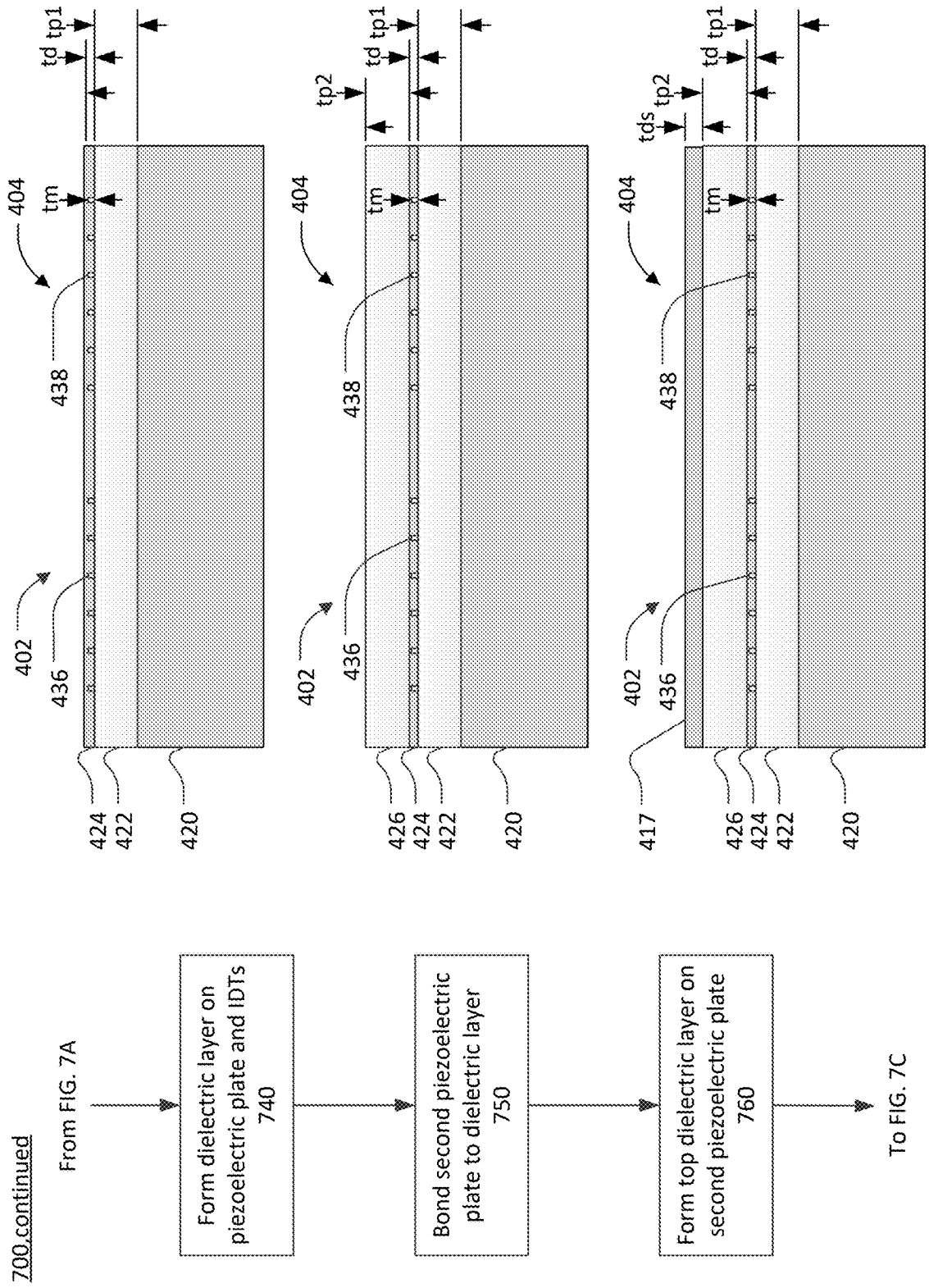

SANDWICHED XBAR FOR THIRD HARMONIC OPERATION

RELATED APPLICATION INFORMATION

The patent claims priority to the following copending U.S. provisional patent applications: application 63/109,300, filed Nov. 3, 2020, entitled 15 GHZ SANDBAR FILTER; and application 63/081,249, filed Sep. 21, 2020, entitled SANDWICHED XBAR FOR 3D HARMONIC OPERATION.

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in patent U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

DESCRIPTION OF THE DRAWINGS

FIGS. 7A, 7B and 7C (collectively "FIG. 7") are a flow chart of another process for fabricating sandwiched XBARs.

Figure 1:
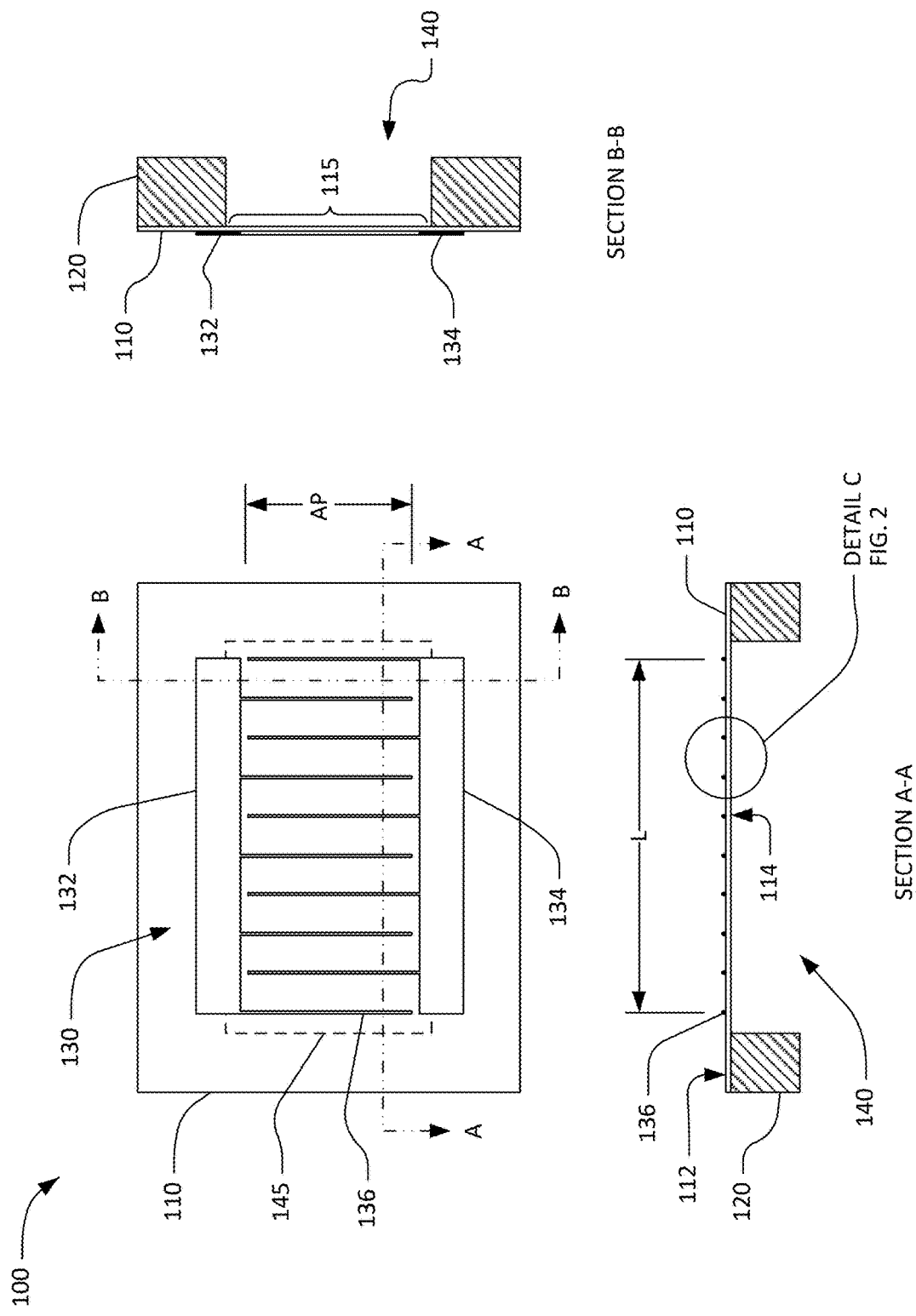
FIG. 1 includes a schematic plan view and two schematic cross-sectional views of a transversely-excited film bulk acoustic resonator (XBAR).

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

The Shear-Mode or Transversely-Excited Film Bulk Acoustic Resonator (XBAR) is a new resonator structure for use in microwave filters. The XBAR is described in patent U.S. Pat. No. 10,491,291, titled TRANSVERSELY EXCITED FILM BULK ACOUSTIC RESONATOR, which is incorporated herein by reference in its entirety. An XBAR resonator comprises an interdigital transducer (IDT) formed on a thin floating layer, or diaphragm, of a piezoelectric material. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

An RF filter may incorporate multiple XBAR devices connected as a conventional ladder filter circuit. A ladder filter circuit includes one or more series resonator connected in series between an input and an output of the filter and one or more shunt resonators, each connected between ground and one of the input, the output, or a node between two series resonators. Each resonator has a resonance frequency where the admittance of the resonator approaches that of a short circuit, and an anti-resonance frequency where the admittance of the resonator approaches that of an open circuit. In a typical ladder band-pass filter circuit, the resonance frequencies of shunt resonators are located below a lower edge of a passband of the filter and the antiresonance frequencies of series resonators are located above an upper edge of the passband.

The frequency of an XBAR is determined primarily by the thickness of the resonator, such as a piezoelectric membrane or diaphragm suspended over a cavity. Currently achievable diaphragm thicknesses allow the use of XBARs in filters for fundamental harmonic or primary shear mode frequency bands up to about 6 GHz. XBAR resonators have second and third harmonics at higher frequencies, but the resonator coupling into those harmonics is insufficient for implementing broad band filters. Resonator coupling here does not convert enough input electro-mechanical energy into output electro-mechanical energy for a filter at those harmonics.

The following describes sandwiched XBAR devices for third ("3rd") harmonic operation and 15 gigahertz (GHz) filters using the 3rd harmonic of sandwiched XBAR devices. A sandwiched XBAR has a sandwiched resonator that is a variation of the XBAR resonator with the IDT electrodes embedded in a layer of dielectric between two thin piezoelectric plates. The plates may be single crystal piezoelectric layers or membranes that are bonded together by the layer of dielectric. By embedding the IDT electrodes in the dielectric layer, this symmetrical sandwiched XBAR structure suppresses spurious modes and provides high coupling into a third harmonic mode. These structures also provide a 15 GHz bandpass filter implemented with sandwiched XBAR resonators.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate 110 is a thin single-crystal layer of a piezoelectric material such as lithium niobate, lithium tantalate, lanthanum gallium silicate, gallium nitride, or aluminum nitride. In sandwiched XBAR cases, plate 110 is two layers or plates of piezoelectric single-crystal material with the IDT electrodes embedded in a layer of dielectric between them. In some sandwiched XBAR cases, plate 110 is two layers or plates of piezoelectric single-crystal material with the IDT electrodes embedded in a layer of dielectric between them and a layer of dielectric over the upper layer of piezoelectric single-crystal material. The piezoelectric plate is cut such that the orientation of the X, Y, and Z crystalline axes with respect to the front and back surfaces is known and consistent. In the examples presented, the piezoelectric plates may be Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX) and crystalline silicon. The back surface 114 of the piezoelectric plate 110 may be bonded to the substrate 120 using a wafer bonding process, or grown on the substrate 120, or attached to the substrate in some other manner. The piezoelectric plate may be attached directly to the substrate or may be attached to the substrate via one or more intermediate material layers.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers 136 overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120. "Cavity" has its conventional meaning of "an empty space within a solid body." The cavity may contain air; or a vacuum. In some case, there is also a second substrate, package or other material having a cavity (not shown) above the plate 110, which may be a mirror image of substrate 120 and cavity 140. The cavity above plate 110 may have an empty space depth greater than that of cavity 140. The fingers extend over and part of the busbars may optionally extend over the cavity (or between the cavities). The cavity 140 may be a hole completely through the substrate 120 (as shown in Section A-A and Section B-B) or a recess in the substrate 120 (as shown subsequently in FIG. 3A). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter 145 of the cavity 140. In this context, "contiguous" means "continuously connected without any intervening item". The diaphragm of a sandwiched XBAR may be described as a sandwiched XBAR diaphragm because it includes two plates of piezoelectric material with the IDT electrodes embedded in a layer of dielectric between them.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2A:
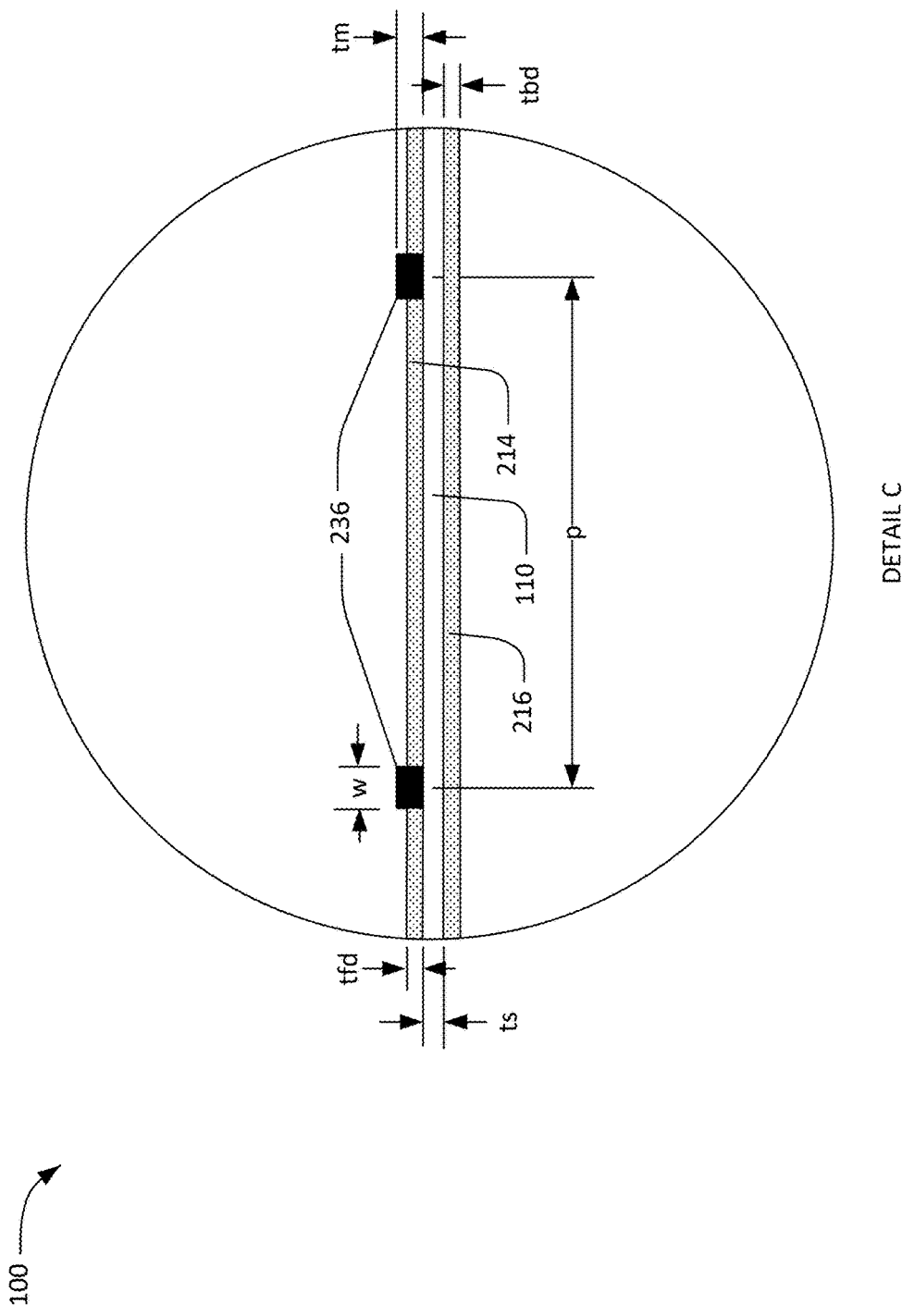
FIG. 2A is an expanded schematic cross-sectional view of a portion of the XBAR of FIG. 1.

FIG. 2A shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands n77, n79), plate 110 may be a single plate with the thickness ts of 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 236. Although not shown in FIG. 2, the front side dielectric layer 214 may also be deposited over the IDT fingers 236. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. The tfd and tbd may be, for example, 0 to 500 nm. tfd and tbd are typically less than the thickness ts of the piezoelectric plate. The tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric.

Further, a passivation layer may be formed over the entire surface of the XBAR device 100 except for contact pads where electric connections are made to circuity external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal electrodes from water and chemical corrosion, particularly for power durability purposes. It may range from 10 to 100 nm. The passivation material may consist of multiple oxide and/or nitride coatings such as SiO2 and Si3N4 material.

The IDT fingers 236 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 2B:
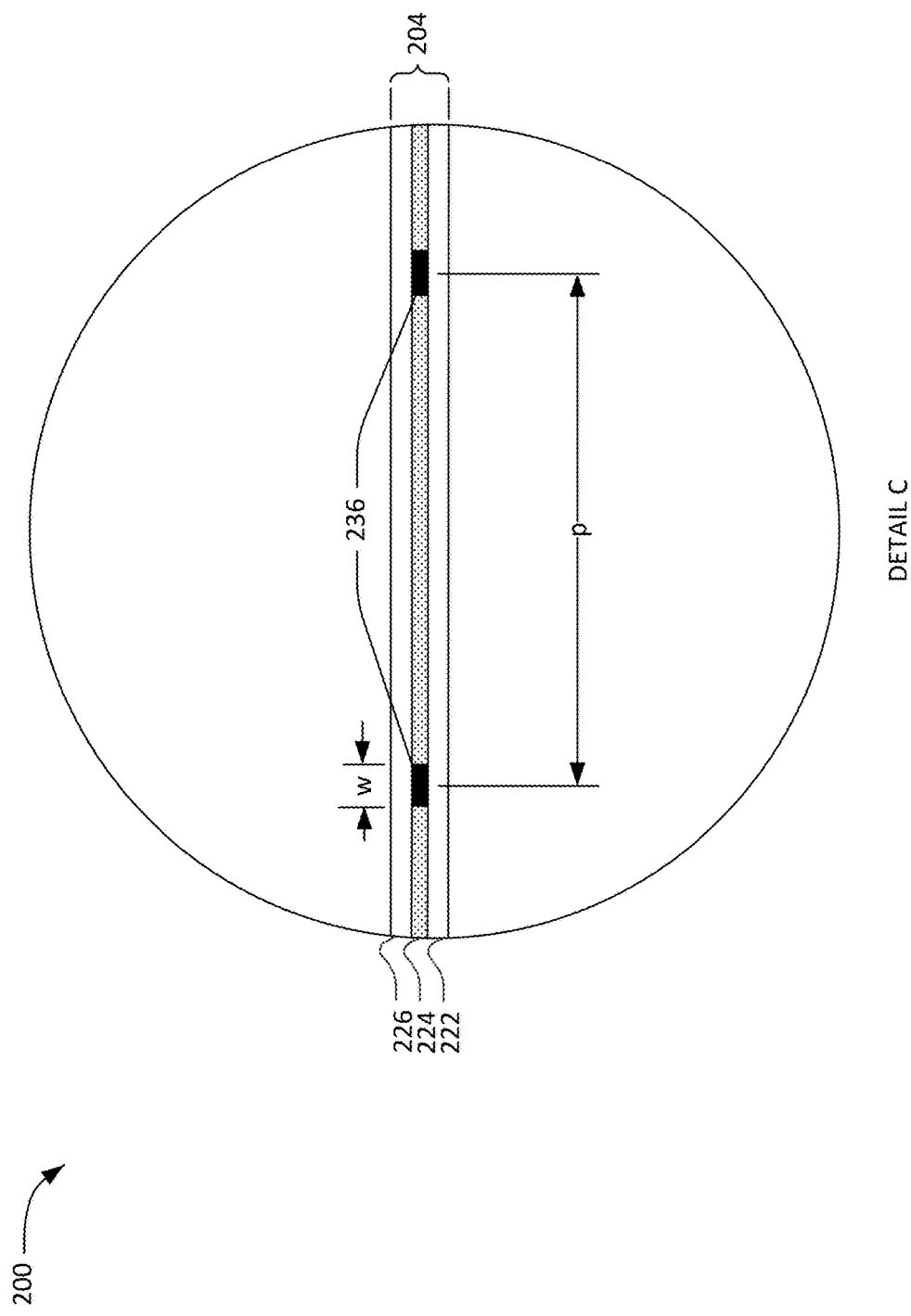
FIG. 2B shows a detailed schematic cross-sectional view of a sandwiched XBAR.

FIG. 2B shows a detailed schematic cross-sectional view of a sandwiched XBAR 200. The cross-sectional view may be a portion of the XBAR 200 that includes fingers 236 of the IDT. The sandwiched resonator 200 has two plates of piezoelectric single-crystal material 222 and 226, bonded together by a layer of dielectric material 224 having the IDT electrodes 236 embedded in it to form a series sandwiched resonator 204. In some sandwiched XBAR cases, sandwiched resonator 200 also has a layer of dielectric 214 over the upper plate 226 of piezoelectric single-crystal material to form a shunt sandwiched resonator (not shown). In sandwiched XBAR cases, the IDT fingers 236 and optionally the busbars are embedded in a layer of dielectric 224 between an upper 226 and a lower 222 plate of piezoelectric single-crystal material. Series and shunt sandwiched resonators are also described at least at FIGS. 3C and 4A.

Figure 3A:
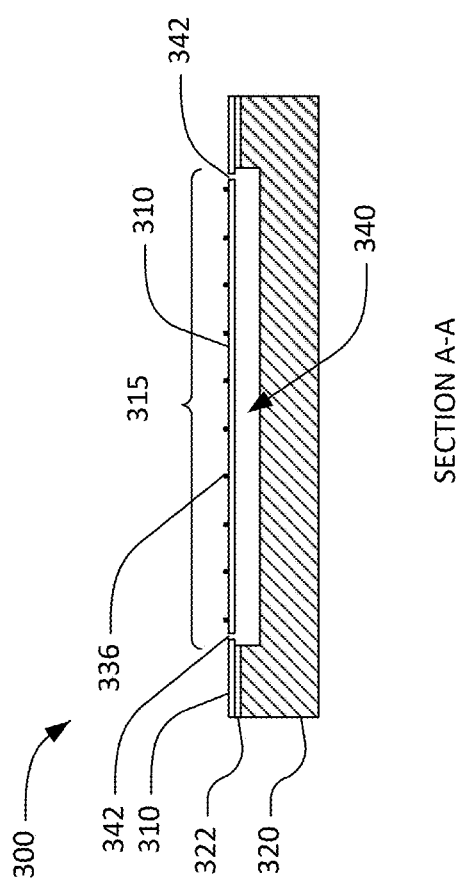
FIG. 3A is an alternative schematic cross-sectional view of the XBAR of FIG. 1.

FIG. 3A is an alternative cross-sectional view of XBAR device 300 along the section plane A-A defined in FIG. 1. In FIG. 3A, a piezoelectric plate 310 is attached to a substrate 320. A portion of the piezoelectric plate 310 forms a diaphragm 315 spanning a cavity 340 in the substrate. The cavity 340, does not fully penetrate the substrate 320, and is formed in the substrate under the portion of the piezoelectric plate 310 containing the IDT of an XBAR. Fingers, such as finger 336, of an IDT are disposed on the diaphragm 315. Plate 310, diaphragm 315 and fingers 336 may be plate 110, diaphragm 115 and fingers 136. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 342 provided in the piezoelectric plate 310. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

One or more intermediate material layers 322 may be attached between plate 310 and substrate 320. An intermediary layer may be a bonding layer, an etch stop layer, a sealing layer, an adhesive layer or layer of other material that is attached or bonded to plate 310 and substrate 320. In other embodiments, the piezoelectric plate 310 is attached directly to the substrate 320 and an intermediary layer does not exist.

While the cavity 340 is shown in cross-section, it should be understood that the lateral extent of the cavity is a continuous closed band area of substrate 320 that surrounds and defines the size of the cavity 340 in the direction normal to the plane of the drawing. The lateral (i.e. left-right as shown in the figure) extent of the cavity 340 is defined by the lateral edges substrate 320. The vertical (i.e. down from plate 310 as shown in the figure) extent or depth of the cavity 340 into substrate 320. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the substrate 320 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

Figure 3B:
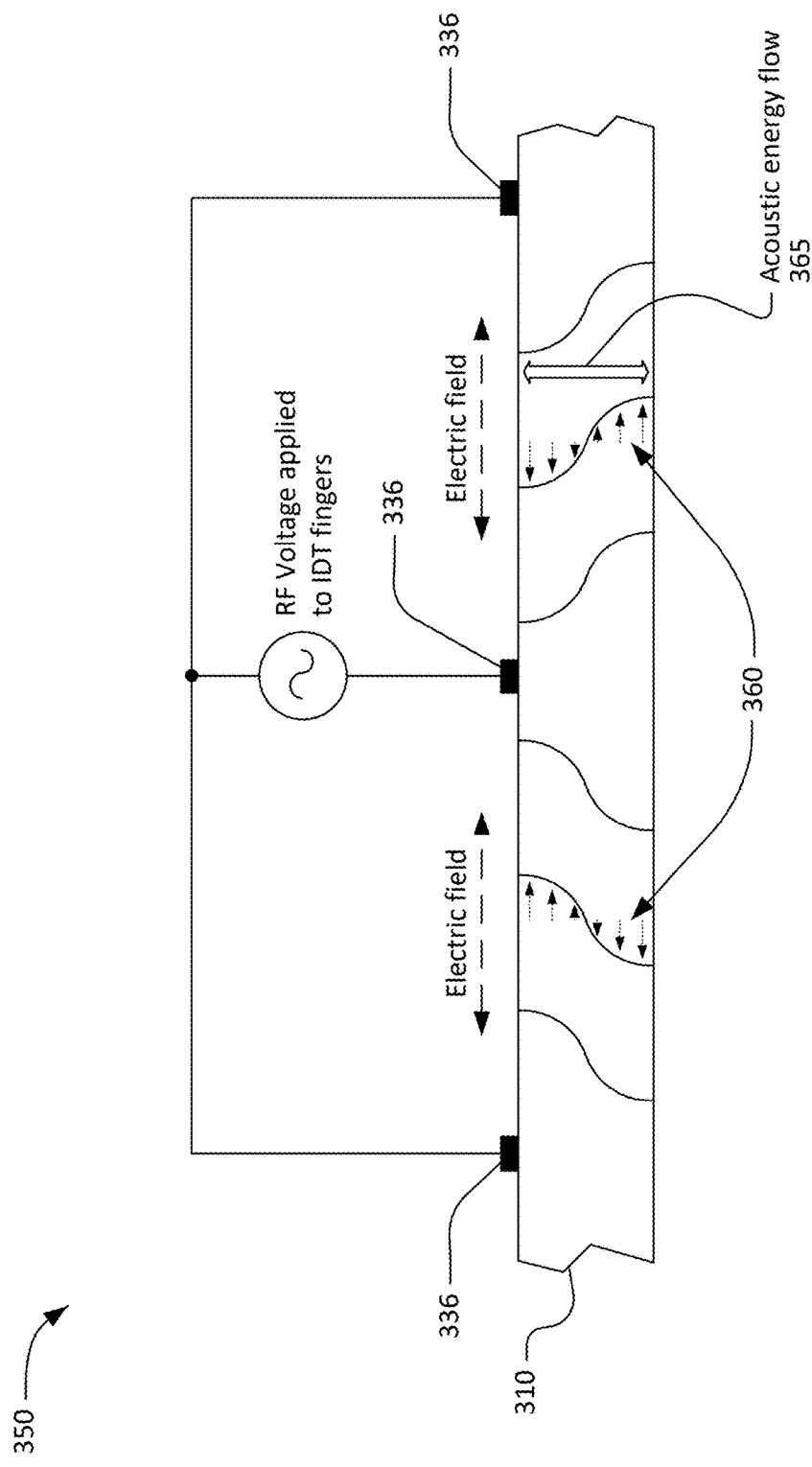
FIG. 3B is a graphical illustration of the primary acoustic mode of interest in an XBAR.

FIG. 3B is a graphical illustration of the primary acoustic mode of interest in an XBAR. FIG. 3B shows a small portion of an XBAR 350 including a piezoelectric plate 310 and three interleaved IDT fingers 336. XBAR 350 may be part of any XBAR herein. An RF voltage is applied to the interleaved fingers 336. This voltage creates a time-varying electric field between the fingers. The direction of the electric field is primarily lateral, or parallel to the surface of the piezoelectric plate 310, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 350 are represented by the curves 360, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3B), the direction of acoustic energy flow of the excited primary shear acoustic mode is substantially orthogonal to the front and back surface of the piezoelectric plate, as indicated by the arrow 365.

Figure 3C:
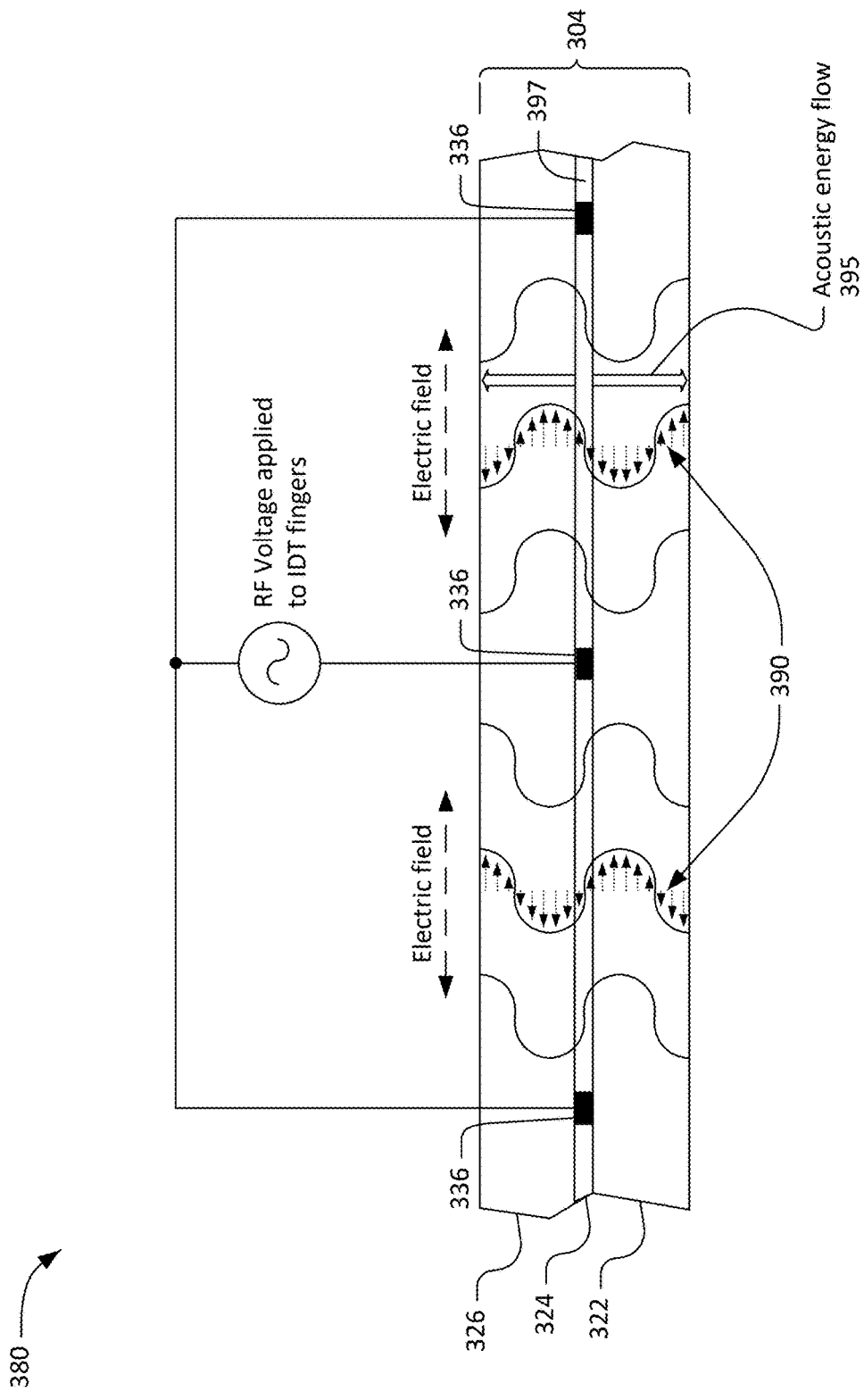
FIG. 3C is a graphical illustration of the third harmonic shear mode of interest in a sandwiched XBAR.

FIG. 3C is a graphical illustration of the third harmonic shear mode of interest in a sandwiched XBAR. FIG. 3C shows a small portion of a sandwiched XBAR 380 including a sandwiched resonator 304 with three interleaved IDT fingers 336 embedded in bonding layer 324. The sandwiched resonator 304 has two plates of piezoelectric single-crystal material 322 and 326, bonded together by a layer of dielectric material 324 having the IDT electrodes 336 embedded in it to form a series sandwiched resonator 304. In some cases, a layer of dielectric can be formed over the upper plate 326 of piezoelectric single-crystal material to form a shunt sandwiched resonator (not shown).

An RF voltage applied to the interleaved fingers 336 creates a time-varying electric field as noted for FIG. 3B. The lateral electric field introduces shear deformation, and in addition to a primary shear mode, also excites a third harmonic or third harmonic shear-mode acoustic mode, in the piezoelectric plate 310. The third shear deformations in the XBAR 380 are represented by the curves 390, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3C), the direction of acoustic energy flow of the excited third harmonic shear mode is substantially orthogonal to the front and back surface of the piezoelectric plate, as indicated by the arrow 395.

FIG. 3C shows a third harmonic shear mode of interest in a sandwiched XBAR bandpass filter using third ("3rd") harmonic operation, such as between 10 GHz and 20 GHz. Here, the 3rd harmonic configuration essentially breaks down into two separate harmonic regions. First, top/bottom harmonic sections above and below a middle dielectric layer having the IDT electrodes embedded in it which can be represented by line 397. These top/bottom harmonic sections essentially separate the first acoustic shear mode resonances with strong coupling. Second, is a middle harmonic shear section. Because of the dielectric and symmetry at line 397, this region does not contribute strongly to the acoustic performance, nor does it negatively impact the coupling.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Single piezoelectric plate resonator XBARs operating at the fundamental harmonic or primary shear mode as in FIG. 3B have frequency inversely proportional to the piezoelectric plate thickness ts. To scale to ~15 GHz frequency output, single piezoelectric plate resonator structures become quite small and spurious modes become serious, thus interfering with resonator frequency accuracy and filter performance. Single piezoelectric plate resonators operating at the third harmonic or third shear mode as in FIG. 3C offer much higher frequency, but in an XBAR device third shear mode coupling is significantly reduced compared to the primary shear mode. Thus, XBAR second and third harmonics have higher frequencies, but the resonator coupling into those harmonics is insufficient for implementing broad band filters.

Figure 4A:
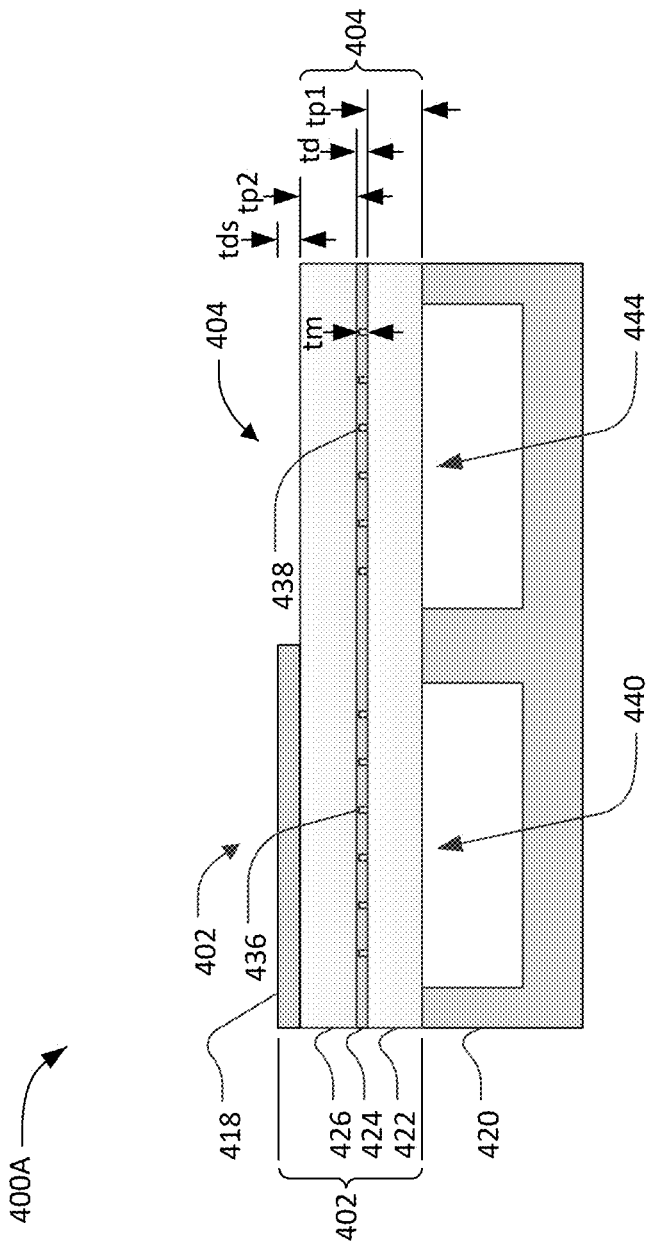
FIG. 4A is a schematic cross-sectional view of sandwiched XBAR resonators
Figure 4B:
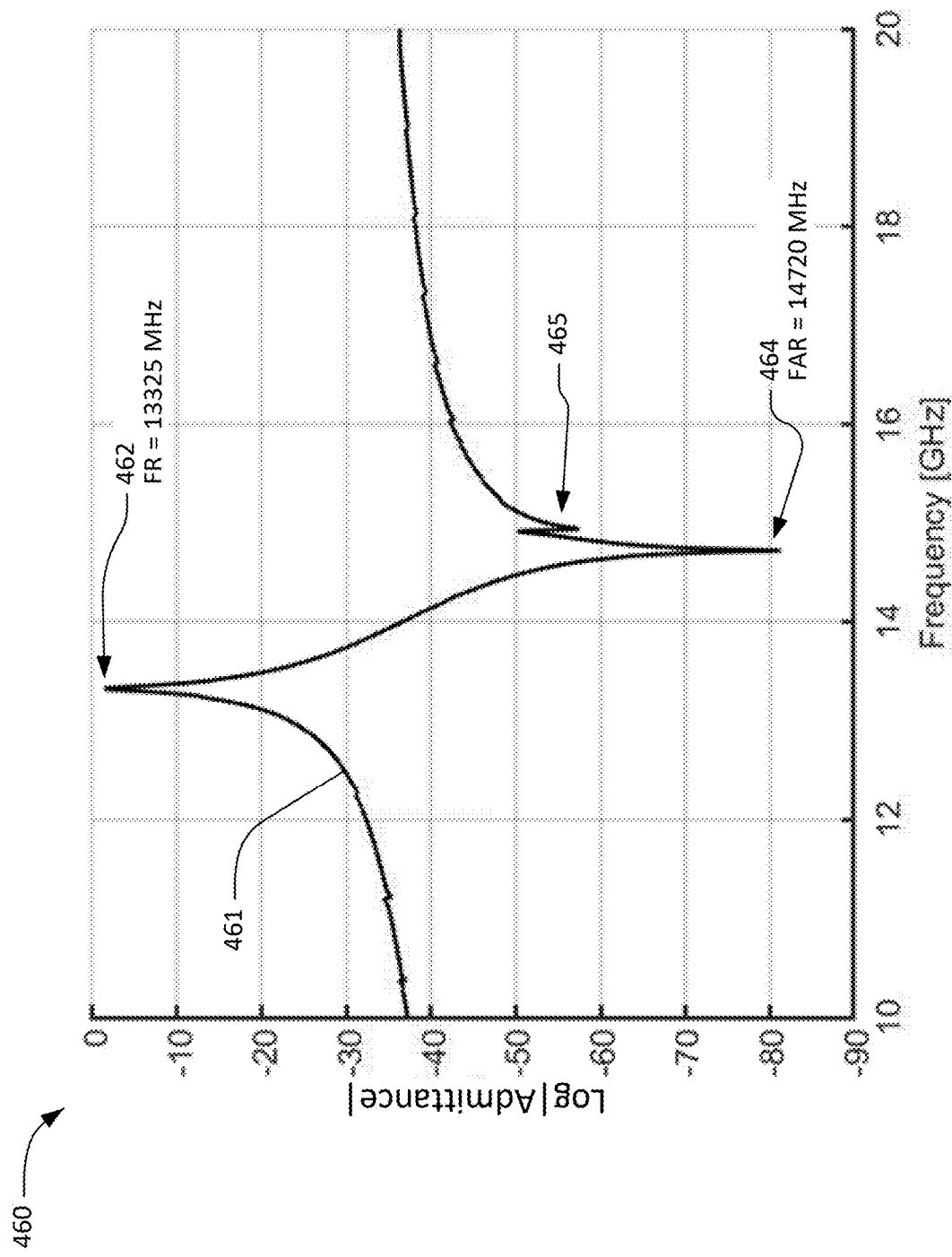
FIG. 4B is a graph that compares shows the admittances of a sandwiched XBAR.

Resonator coupling may be determined by metrics including fr–fa spacing, fractional bandwidth, coupling keff^2, Bode Q @fr and/or Bode Q @fa, such as noted for FIG. 4B. For a resonator with resonant frequency fr and anti-resonant frequency fa keff^2 is defined herein as: keff^2=(fa^2−fr^2)/fa^2. This keff^2 runs intuitively with the word coupling, such that larger keff^2=larger coupling. Also, a spurious mode may support extra, unwanted signals, in addition to the intended signals. These modes can cause interference and degradation of the intended signals. In some cases, a spurious mode or emission is a response at a frequency or range of frequencies that is not deliberately created or transmitted, especially in a device which normally generates other frequencies. A harmonic or other signal outside a resonator's assigned fr–fa spacing would be considered an example of a spurious mode.

However, it is possible to create a sandwiched XBAR for third ("3rd") harmonic operation by embedding the IDT electrodes in a dielectric layer that bonds an upper to a lower piezoelectric plate. This symmetrical sandwiched XBAR structure suppresses spurious modes and provides high coupling into a third harmonic mode. It is also possible to create a 15 GHz bandpass filter using the 3rd harmonic of the sandwiched XBAR.

FIG. 4A is a schematic cross-sectional view of sandwiched XBAR resonators 402 and 404 formed on the same die 400A with different resonators thicknesses. Die 400A may be or may be part of a filter device having resonator 402 as lower frequency shunt resonator and resonator 404 as a higher frequency series resonator with respect to the input and output of the filter device. In any case, resonator 402 or 404 can be any of the resonators described herein. A "die" may be a semiconductor chip or integrated circuit (IC) chip that is diced from other chips such as of a wafer. It may be a monolithic integrated circuit (also referred to as an IC, a chip, or a microchip) that has a set of electronic circuits on one small flat piece (or "chip") of semiconductor material that is normally silicon.

Die 400A has substrate 420 having a first cavity 440 and a second cavity 444. A first sandwiched XBAR resonator 402 spans the first cavity 440; and a second sandwiched XBAR resonator 404 spans the second cavity 444. Spanning the cavity may include plate 422 of the resonators being bonded directly to substrate 420. In some cases, spanning the cavity is when plate 422 is bonded to substrate 420 with one or more intervening layers. The first resonator 402 includes piezoelectric plate 422, dielectric layer 424 having IDT interleaved fingers 436, piezoelectric plate 426 and front side dielectric layer 418. The second resonator 404 includes piezoelectric plate 422, dielectric layer 424 having IDT interleaved fingers 438 and piezoelectric plate 426 but not layer 418. Plate 422 and 426 may each be single crystal piezoelectric plate as noted for plate 110 and/or 310. Layer 424 may be a bonding layer that bonds the two plates to each other. Fingers 436 and 438 may be IDT electrodes or fingers, optionally with part or all of busbars as noted herein. Fingers 436 and 438 may span or be over cavities 440 and 444, respectively. In some cases, part of the busbars of the IDTs is also over the cavities. In other cases, all of the busbars are over the substrate 420. At least portions of the busbars are over the substrate 420 (e.g., not over the cavities) to better conduct heat generated in the IDTs to the substrate. Fingers 436 and 438 both have thickness tm. Resonators 402 and 404 may be composite (at least two material) layers that include plate 426 chemically or molecularly bonded to layer 424 that is chemically or molecularly bonded to plate 422. Fingers 436 and 438 are formed onto or bonded to plate 422 and covered over by a thickness of layer 424 that is sufficient to bond to layer 426. Resonator 402 may also have dielectric layer 418 chemically or molecularly bonded to plate 426, and plate 426 may have been patterned and etched away from the top of resonator 404. This etch may use layer 426 as an etch stop. Resonator 402 or 404 may be used in place of plate 110 and/or 310 of FIGS. 1-3C.

The piezoelectric plates 422 and 426 have a thickness tp1 and tp2 which each may be between 80 and 300 nm. The dielectric layer 424 has a thickness td which may be between 50 and 150 nm. Dielectric layer 418 has a thickness tds which may be between 20 and 100 nm. In some cases, tp1 and tp2 are both either 129, 150 or 170 nm; tm is 80 nm; and td is 91 nm. Tds can be 43 nm. In some cases, tp1 and tp2 are the same and can be between 120 and 180 nm. The piezoelectric plate 422 and/or piezoelectric plate 426 may be a material and may be cut as noted for plate 110. In some cases, they are the same material. in other cases, they are different materials. In some cases, they have the same crystallographic orientation, while in other cases they do not.

The dielectric layer 424 is bonded to the top surface of plate 422 and extends over or covers the fingers 436 and 438. The dielectric layer 424 may be or include Al2O3 or SiO2. The thickness td is greater than thickness tm so that plate 426 bonds better to dielectric layer 424 than if those thicknesses were the same and plate 426 were bonding to the dielectric layer 424 and the tops of the fingers 436 and 438. Thickness td may be greater than thickness tm by between 5 and 20 nm.

Respective radio frequency signals applied to the IDTs of resonators 402 and 404 excite respective third harmonic shear modes in the piezoelectric plates 422 and 426 over the cavities 440 and 444, respectively. The thickness of the piezoelectric plates 422 and 426 can be selected to tune the third harmonic shear mode frequency of the resonators. Also, the thickness of the dielectric layer 418 can be selected to tune the third harmonic shear mode frequency in the resonator 402. Sandwiched XBAR 200, 380 and/or 400A may be used in place of plate 310 to provide sandwiched resonators with interleaved IDT fingers embedded in a bonding layer between two piezoelectric layers to filter using third harmonic shear mode frequencies.

FIG. 4B is a graph 460 that shows the admittances of a sandwiched XBAR resonator. Graph 460 plots of the magnitude of the admittance (on a logarithmic scale) as a function of frequency of the XBAR simulated using finite element method (FEM) simulation techniques. For example, in usual parlance, this simulation may be a two-dimensional, where the depth direction and length dimension (e.g., for the number of fingers) are simulated, but the aperture direction is not. The admittance plot 461 results from a FEM simulation of sandwiched XBAR resonator 404 with a sample structure having: pitch of the IDT fingers p=4 um, width of the IDT fingers w=0.5 um; thickness of the IDT fingers tm=80 nm, thickness of the dielectric layer 424 td=91 nm; and plates 422 and 426 are both thickness tp1=tp2=150 nm of Z-cut LiNbO3 material. The metal fingers 438 are completely covered by dielectric 424 and polished to a smooth surface for bonding with the top piezoelectric plate 426.

This sample XBAR structure that provides graph 460 is a sandwiched XBAR resonator for third ("3rd") harmonic operation between 13 GHz and 15 GHz. For example, the extracted resonator parameters show resonant frequency 462 at 13325 MHz, anti-resonant frequency 464 at 14720 MHz, Fr–fa Spacing of 1395 MHz, Fractional Bandwidth of 10%, Coupling keff^2 of 18.2%, Bode Q @fr of 300 and/or Bode Q @fa of 900. Graph 460 shows that by sandwiching the electrode structure 438 and 438 between two piezoelectric plates 422 and 426, the 3rd harmonic mode is selectively excited. The relative resonance anti-resonance frequency spacing (RAR) is computed as:

$$RAR = \frac{f_a - f_R}{\frac{1}{2}(f_a + f_r)}$$

Graph 460 also shows spur at 465 outside the RAR.

Figure 4C:
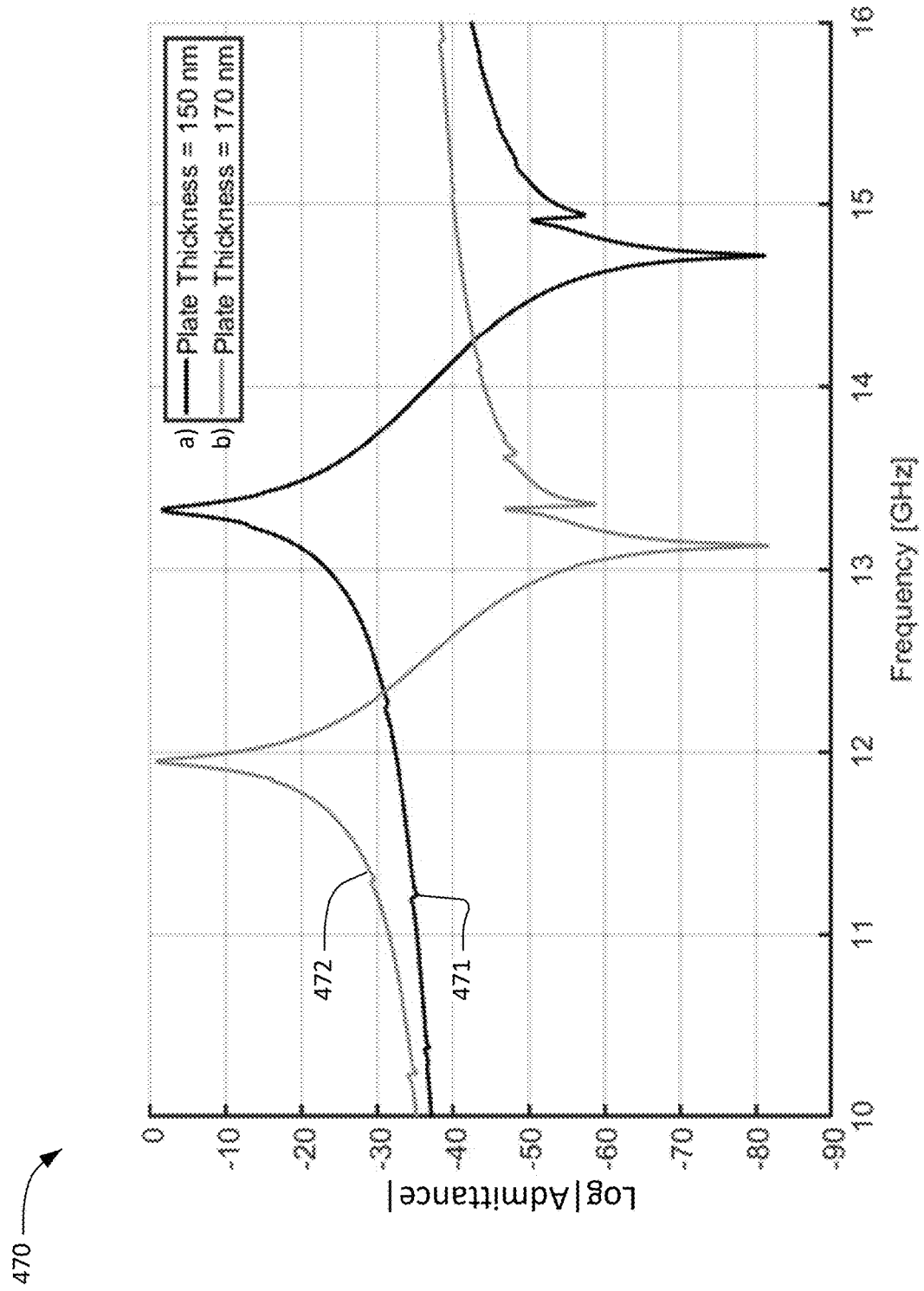
FIG. 4C is a graph that compares the admittances of two sandwiched XBARs having different piezoelectric plate thicknesses.

FIG. 4C is a graph 470 that compares the admittances of sandwiched XBAR resonators with different resonator structures. Graph 470 plots of the magnitudes of the admittances as a function of frequency of the XBARs simulated using FEM simulation techniques. The admittance data results from a FEM simulation of XBARs with the following differences in parameters: a) plot 471 is for the sandwiched XBAR resonator 404 of FIG. 4B (e.g., it is plot 461); and b) plot 472 for the sandwiched XBAR resonator 404 of FIG. 4B where tp1 and tp2 are each 170 nm, instead of 150 nm.

These sample XBAR structures that provide graph 470 are sandwiched XBAR resonators for third ("3rd") harmonic operation between 11 GHz and 15 GHz. For example, the extracted resonator parameters show a change in: resonant frequency from 13325 MHz to 11952 MHz, anti-resonant frequency from 14720 MHz to 13125 MHz when tp1 and tp2 change from 150 nm to 170 nm. Thus, graph 470 shows that device frequency can be controlled by selecting piezoelectric plate thickness tp1 and tp2 of a sandwiched XBAR, similar to selecting a thickness of a monolithic plate for a non-sandwiched XBAR device.

Figure 5A:
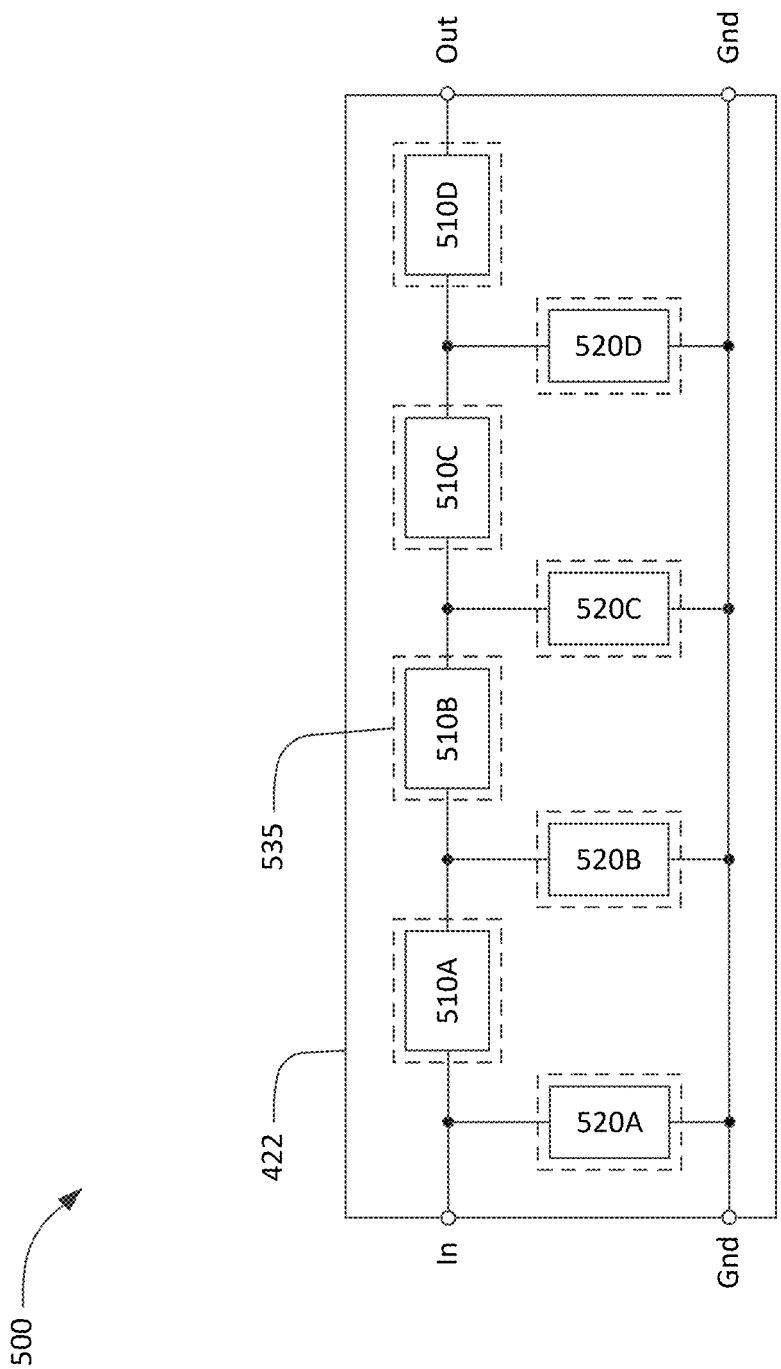
FIG. 5A is a schematic block diagram of a filter using sandwiched XBARs.

FIG. 5A is a schematic circuit diagram and layout for a high frequency band-pass filter 500 using eight sandwiched XBARs. The filter 500 has a conventional (half) ladder filter architecture including four series resonators 510A, 510B, 510C and 510D which may each include or be resonator 404 and four shunt sandwiched XBAR resonators 520A, 520B, 520C and 520D which may each include or be resonator 402. The four series resonators 510A, 510B, 510C and 510D are connected in series between a first port and a second port. In FIG. 5A, the first and second ports are labeled "In" and "Out", respectively. However, the filter 500 is bidirectional and either port and serve as the input or output of the filter. The four shunt resonators 520A, 520B, 520C and 520D are connected to ground from nodes between a port and a series resonator or between the series resonators. All the shunt resonators and series resonators are sandwich XBARs on a single die.

The four series resonators 510A, B, C, D and the four shunt resonators 520A, B, C, D of the filter 500 are formed on a single plate 422 of piezoelectric material bonded to a silicon substrate (not visible). The series and shunt resonators all have dielectric layer 424 with embedded IDT electrodes 436 and 438 formed on single plate 422 of piezoelectric material and plate 426 formed on layer 424. The four series resonators 510A, B, C, D do not have but the four shunt resonators 520A, B, C, D have dielectric layer 418 bonded to the dielectric layer 424. Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5A, the cavities are illustrated schematically as the dashed rectangles (such as the rectangle 535 which may be similar to perimeter 145). In this example, each IDT is disposed over a respective cavity. In other filters, the IDTs of two or more resonators may be disposed over a single cavity.

Figure 5B:
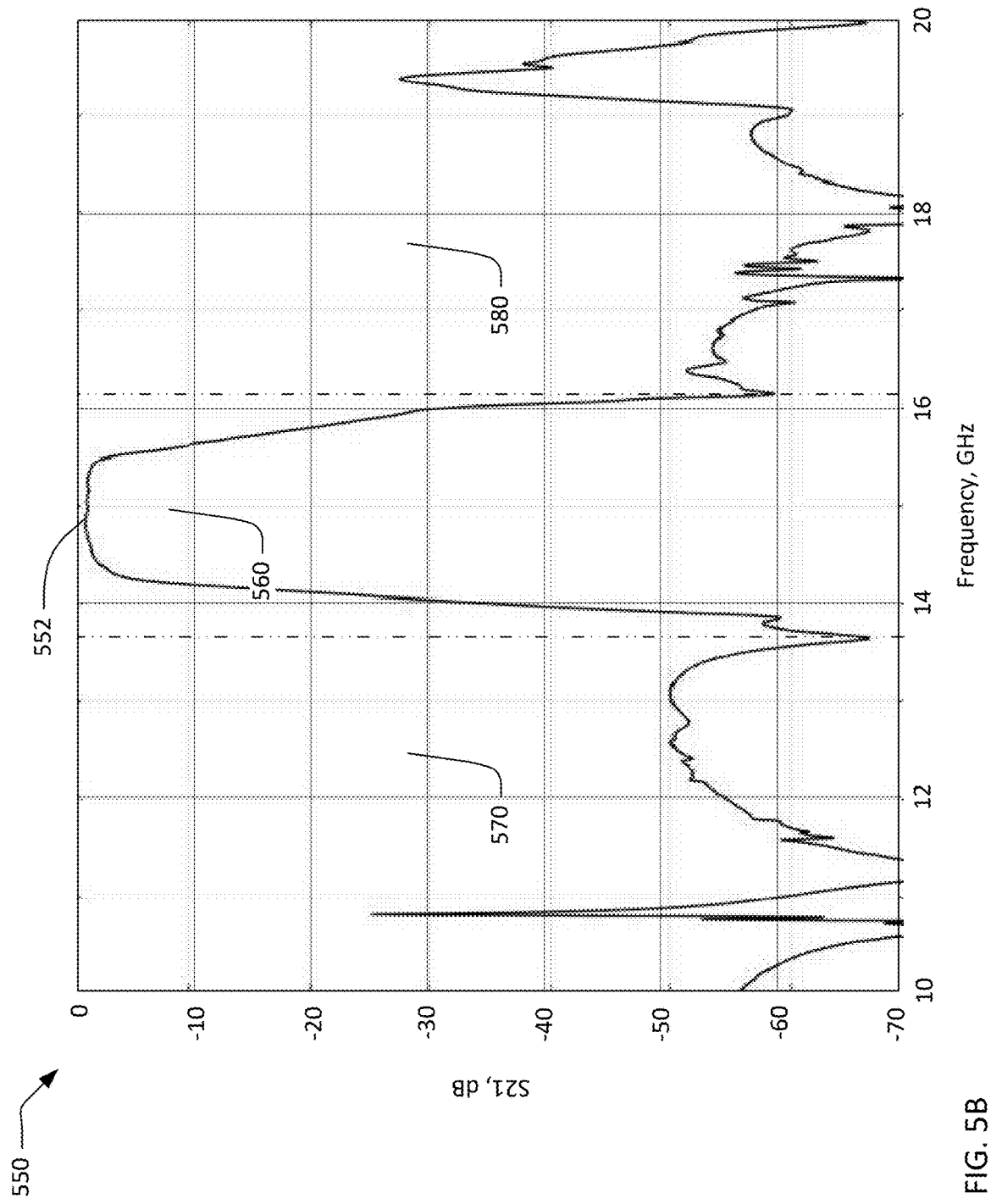
FIG. 5B is a graph of the transmission through a bandpass filter using sandwiched XBARs.

FIG. 5B shows graph 500 having a plot 552 of the transmission (S21) through a bandpass filter including eight sandwiched XBARs in formed on a single die. The plot of the transmission (S21) may be for the filter 500 of FIG. 5A with using series resonators 510A-D and shunt resonators 520A-D with sample structures having: pitch of the IDT fingers p of between 3.2 and 4.6 um; width of the IDT fingers w of between 0.49 and 0.78 um; length L of the IDT electrodes or fingers of between 165 and 248 um; width AP of the electrodes or fingers of between 35 and 65 um; tp1 and tp2 are both 129 nm of single crystal LiNbO3; tm is 80 nm of Al/Metal; td is 91 nm of SiO2/dielectric Oxide; and tds is 43 nm of SiO2/dielectric Oxide on resonators 520A-D but not on resonators 510A-D. The series resonators 510A-D have coupling keff^2 of 19% +/−0.5%; and shunt resonators 520A-D have coupling kef^2 of 16.1% +/−0.4%. The solid line 552 is a transmission plot of S12 for the sample structure filter based on simulations of the filter using finite element methods.

This sample XBAR structure that provides graph 460 for a 15 GHz bandpass filter using the 3rd harmonic of the sandwiched XBARs. For example, the extracted filter parameters of plot 552 show area 560 with IL of 1.5 dB and RL of 12 dB at 14.4 to 15.35 GHz; area 570 with Rej. of 50 dB @11 to 13.68 GHz; and area 580 with Rej. of 50 dB @16.12 to 19 GHz. These are parameters of a functional bandpass RF filter for the front end receiver of a 5G cell phone.

Description of Methods

Fabricating a bandpass filter at 15 GHz using SAW or BAW resonators is challenging because: the small size of all the structures makes it difficult to fabricate and control; the low coupling of the resonators reduces input to output energy transfer; and spurious modes interfere with desired signal output. For instance, the frequency of fundamental or primary mode of the XBAR resonators is inversely proportional to the thickness of the piezoelectric plate. As a result, as frequency increases to 15 GHz, all the structures become quite small. Furthermore, the spurious mode becomes significant and coupling is diminished. Although the 3rd harmonic mode of prior XBAR resonators has much higher frequency, the coupling is considerably low (i.e., much lower keff^2 compared to the primary mode). However, it is possible to fabricate 3rd harmonic mode series and shunt Sandwiched XBAR resonators having comparatively higher coupling (higher keff^2) and controlled spurious mode to design a 15 GHz sandwiched XBAR filter.

Figure 6:
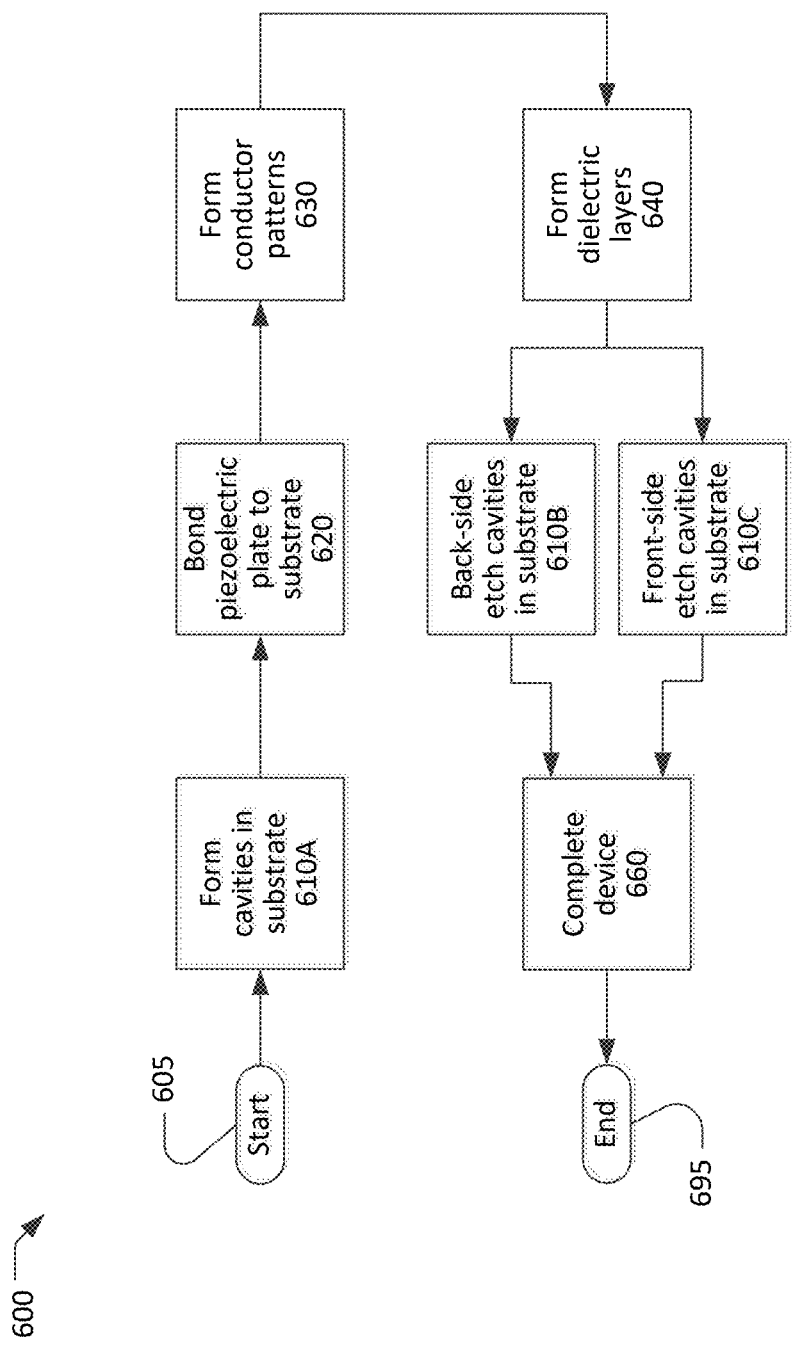
FIG. 6 is a flow chart of a process for fabricating a sandwiched XBAR.

FIG. 6 is a simplified flow chart showing a process 600 for making a sandwiched XBAR or a filter incorporating sandwiched XBARs. The process 600 starts at 605 with a substrate and a plate of piezoelectric material which may be plate 422 and ends at 695 with a completed sandwiched XBAR or filter. As will be described subsequently, the piezoelectric plate may be mounted on a sacrificial substrate or may be a portion of wafer of piezoelectric material. The flow chart of FIG. 6 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 6.

The flow chart of FIG. 6 captures three variations of the process 600 for making an XBAR which differ in when and how cavities are formed in the substrate. The cavities may be formed at steps 610A, 610B, or 610C. Only one of these steps is performed in each of the three variations of the process 600.

The piezoelectric plate may be, for example, Z-cut, rotated Z-cut, or rotated Y-cut lithium niobate, lithium tantalate or a material noted for plate 110. The piezoelectric plate may be some other material and/or some other cut. The plate may be plate 422. The substrate may be silicon. The substrate may be some other material that allows formation of deep cavities by etching or other processing. The silicon substrate may have layers of silicon TOX and polycrystalline silicon.

In one variation of the process 600, one or more cavities are formed in the substrate 120, 320, 420 at 610A, before the piezoelectric plate is bonded to the substrate at 620. A separate cavity may be formed for each resonator in a filter device. The one or more cavities may be formed using conventional photolithographic and etching techniques. These techniques may be isotropic or anisotropic; and may use deep reactive ion etching (DRIE). Typically, the cavities formed at 610A will not penetrate through the substrate or layer 320, 420, and the resulting resonator devices will have a cross-section as shown in FIG. 3A or 4A.

At 620, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

In a first variation of 620, the piezoelectric plate is initially mounted on a sacrificial substrate. After the piezoelectric plate and the substrate are bonded, the sacrificial substrate, and any intervening layers, are removed to expose the surface of the piezoelectric plate (the surface that previously faced the sacrificial substrate). The sacrificial substrate may be removed, for example, by material-dependent wet or dry etching or some other process.

In a second variation of 620 starts with a single-crystal piezoelectric wafer. Ions are implanted to a controlled depth beneath a surface of the piezoelectric wafer (not shown in FIG. 6). The portion of the wafer from the surface to the depth of the ion implantation is (or will become) the thin piezoelectric plate and the balance of the wafer is effectively the sacrificial substrate. After the implanted surface of the piezoelectric wafer and device substrate are bonded, the piezoelectric wafer may be split at the plane of the implanted ions (for example, using thermal shock), leaving a thin plate of piezoelectric material exposed and bonded to the substrate. The thickness of the thin plate piezoelectric material is determined by the energy (and thus depth) of the implanted ions. The process of ion implantation and subsequent separation of a thin plate is commonly referred to as "ion slicing". The exposed surface of the thin piezoelectric plate may be polished or planarized after the piezoelectric wafer is split.

The piezoelectric plate bonded to the substrate at 620 may be plate 422. Bonding the plate at 620 may include descriptions for forming sandwiched XBAR resonator 402 and/or 404 at FIGS. 4A and/or 7A-C.

Conductor patterns and dielectric layers defining one or more XBAR devices are formed on the surface of the piezoelectric plate at 630. Typically, a filter device will have two or more conductor layers that are sequentially deposited and patterned. The conductor layers may include bonding pads, gold or solder bumps, or other means for making connection between the device and external circuitry. The conductor layers may be, for example, aluminum, an aluminum alloy, copper, a copper alloy, molybdenum, tungsten, beryllium, gold, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layers and the piezoelectric plate. The conductor layers may include bonding pads, gold or solder bumps, or other means for making connection between the device and external circuitry.

Conductor patterns may be formed at 630 by depositing the conductor layers over the surface of the piezoelectric plate and removing excess metal by etching through patterned photoresist. Alternatively, the conductor patterns may be formed at 630 using a lift-off process. Photoresist may be deposited over the piezoelectric plate and patterned to define the conductor pattern. The conductor layer may be deposited in sequence over the surface of the piezoelectric plate. The photoresist may then be removed, which removes the excess material, leaving the conductor pattern. In some cases, forming at 630 occurs prior to bonding at 620, such as where the IDT's are formed prior to bonding the plate to the substrate.

Forming conductor patterns at 630 may include descriptions for forming sandwiched XBAR resonator 402 and/or 404 at FIGS. 4A and/or 7A-C.

At 640, a front-side dielectric layer or layers may be formed by depositing one or more layers of dielectric material on the front side of the piezoelectric plate, over one or more desired conductor patterns of IDT or XBAR devices. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. In some cases, depositing at 640 includes depositing a first thickness of at least one dielectric layer over the front-side surface of selected IDTs, but no dielectric or a second thickness less than the first thickness of at least one dielectric over the other IDTs. An alternative is where these dielectric layers are only between the interleaved fingers of the IDTs.

The one or more dielectric layers may include, for example, a dielectric layer selectively formed over the IDTs of shunt resonators to shift the resonance frequency of the shunt resonators relative to the resonance frequency of series resonators as described in U.S. Pat. No. 10,491,192. The one or more dielectric layers may include an encapsulation/passivation layer deposited over all or a substantial portion of the device.

The different thickness of these dielectric layers causes the selected XBARs to be tuned to different frequencies as compared to the other XBARs. For example, the resonance frequencies of the XBARs in a filter may be tuned using different front-side dielectric layer thickness on some XBARs. The different thicknesses of the piezoelectric plates noted at 620 can be used as a replacement for or in combination with having these different thickness dielectric layers to tune the XBARS. As compared to the admittance of an XBAR with tfd=0 (i.e. an XBAR without dielectric layers), the admittance of an XBAR with tfd=30 nm dielectric layer reduces the resonant frequency by about 145 MHz compared to the XBAR without dielectric layers. The admittance of an XB AR with tfd=60 nm dielectric layer reduces the resonant frequency by about 305 MHz compared to the XBAR without dielectric layers. The admittance of an XBAR with tfd=90 nm dielectric layer reduces the resonant frequency by about 475 MHz compared to the XBAR without dielectric layers. Importantly, the presence of the dielectric layers of various thicknesses has little or no effect on the piezoelectric coupling.

Forming front dielectric layers at 640 may include descriptions for forming sandwiched XBAR resonator 402 and/or 404 at FIGS. 4A and/or 7A-C.

In some sandwiched XBAR cases, after 620-640 the plate or resonator bonded to the substrate at 620 may be have be two plates of piezoelectric single-crystal material, bonded together by a layer of dielectric material having the IDT electrodes embedded in it to form a sandwiched series XBAR, and also having a layer of dielectric over the upper plate of piezoelectric single-crystal material to form a sandwiched shunt XBAR. The sandwiched XBARs may use a thickness of dielectric frequency setting layer 418 that is selected to cause selected shunt XBARs to be tuned to different frequencies as compared to the series XBARs.

In a second variation of the process 600, one or more cavities are formed in the back side of the substrate at 610B after all the conductor patterns and dielectric layers are formed at 630. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In a third variation of the process 600, one or more cavities in the form of recesses in the substrate may be formed at 610C by etching a sacrificial layer formed in the front side of the substrate using an etchant introduced through openings in the piezoelectric plate. A separate cavity may be formed for each resonator in a filter device. The one or more cavities may be formed using an isotropic or orientation-independent dry or wet etch that passes through holes in the piezoelectric plate and etches a recesses in the front-side of the substrate. The one or more cavities formed at 610C will not penetrate completely through the substrate, and the resulting resonator devices will have a cross-section as shown in FIG. 3A or 4A. For variations 610B and 610C, descriptions above regarding cavities at 620-640 are regarding locations for the cavities, prior to forming the cavities at 610B or 610C.

In all variations of the process 600, the sandwiched filter or XBAR device is completed at 660. Actions that may occur at 660 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 660 is to tune the resonant frequencies of the resonators within a filter device by adding or removing metal or dielectric material from the front side of the device. After the filter device is completed, the process ends at 695. FIGS. 1-4A may show examples of the fingers of selected IDTs after completion at 660.

Forming the cavities at 610A may require the fewest total process steps but has the disadvantage that the XBAR diaphragms will be unsupported during all of the subsequent process steps. This may lead to damage to, or unacceptable distortion of, the diaphragms during subsequent processing.

Forming the cavities using a back-side etch at 610B requires additional handling inherent in two-sided wafer processing. Forming the cavities from the back side also greatly complicates packaging the XBAR devices since both the front side and the back side of the device must be sealed by the package.

Forming the cavities by etching from the front side at 610C does not require two-sided wafer processing and has the advantage that the XBAR diaphragms are supported during all of the preceding process steps. However, an etching process capable of forming the cavities through openings in the piezoelectric plate will necessarily be isotropic.

Figure 7A:
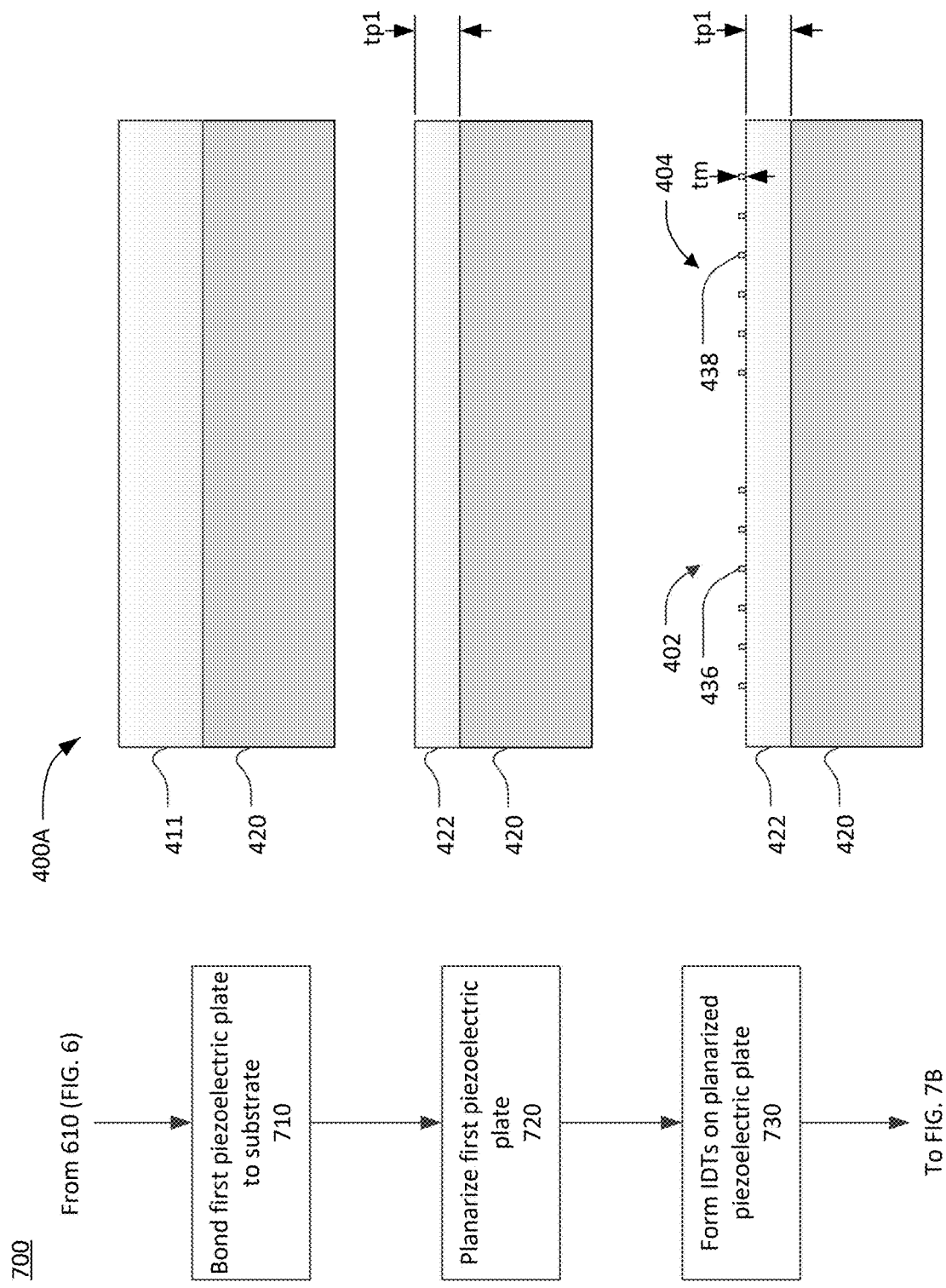
Figure 7C:
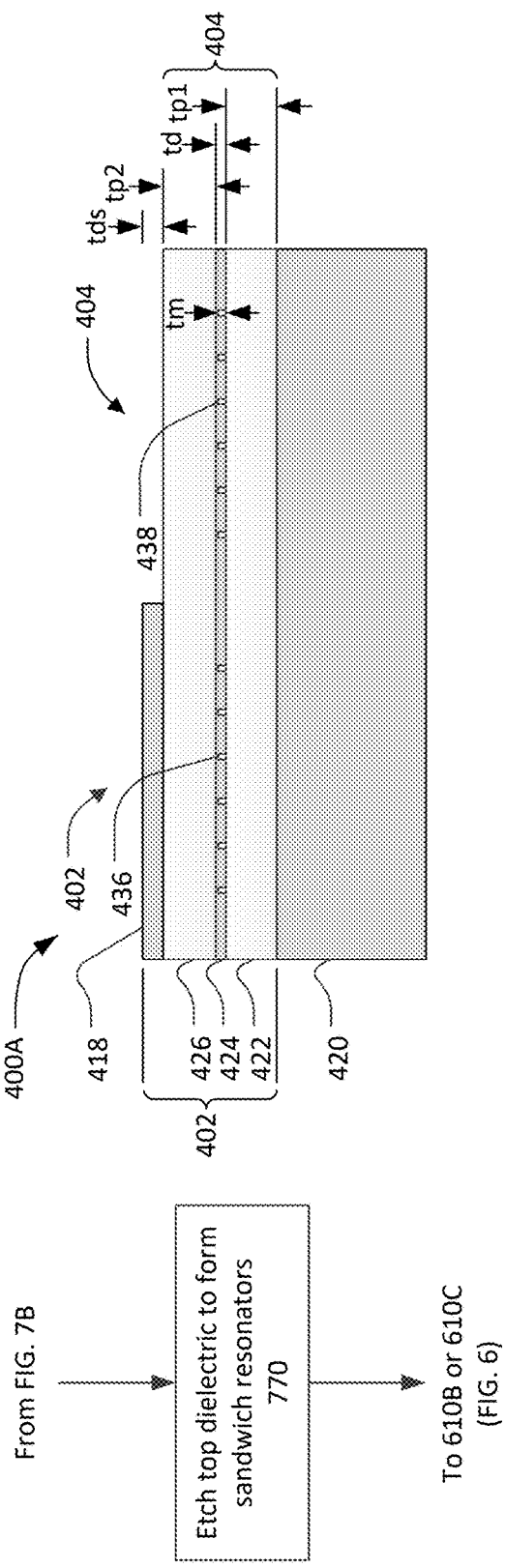

FIG. 7A, FIG. 7B, and FIG. 7C (collectively "FIG. 7") are a simplified flow chart of an improved process 700 for fabricating an sandwiched XBARs with sandwiched resonators 402 and 404 on the same die 400A, such as shown in FIG. 4A. Process 700 may describe fabricating two (or more) different sandwiched XBARs on the same die to create a 15 GHz bandpass filter. To the right of each action in the flow chart is a schematic cross-sectional view representing the end of each action. The process 700 starts at 710 in FIG. 7A with a substrate 420 and a first plate of piezoelectric material 411. The first piezoelectric plate may be mounted on a sacrificial substrate or may be a portion of wafer of piezoelectric material as previously described. The process 700 ends at 785 in FIG. 7C with completed sandwiched XBARs with resonators 402 and 404 formed on the same die. The flow chart of FIG. 7 includes only major process steps. Various conventional process steps (e.g. surface preparation, cleaning, inspection, deposition, photolithography, baking, annealing, monitoring, testing, etc.) may be performed before, between, after, and during the steps shown in FIG. 7.

At 710, first piezoelectric plate 411 is bonded to substrate 420. Bonding at 710 may be bonding a piezoelectric wafer to a silicon carrier wafer. This bonding may represent or be any of the processes for forming a piezoelectric plate noted at 620. First piezoelectric plate 411 and substrate 420 may be materials described for and bonded as noted for any of the plates and substrates as noted herein. Substrate 420 may include, prior to bonding, or be later etched to form cavities 440 and 444 (not shown in FIG. 7) as shown in FIG. 4A. Those cavities may be formed by any process noted at 610A, 610B or 610C.

At 720, first piezoelectric plate 411 is planarized to form piezoelectric plate 422 having thickness tp1. Planarizing at 720 may be accurately thinning the thickness of a piezoelectric wafer to thickness of tp1. At 720, the exposed surface of first piezoelectric plate 411 may be polished or planarized such as using chemical mechanical processing (CMP) from a thickness greater than thickness tp1 as shown at 710, down to thickness tp1 as shown at 720.

At 730, IDTs are formed over portions of plate 422 where the shunt resonator 402 and series resonator 404 are to be formed, respectively. Forming the IDTs at 730 includes forming fingers 436 and 438. It may also include forming busbars, contact pads and/or other IDT electrode structures. During forming at 730, layer 422 may function as an etch stop layer. Forming IDTs at 730 may include descriptions for forming IDTs at 630 of FIG. 6.

Forming the IDTs at 730 may include etch-back processing which commences with blanket depositing IDT conductor material over the exposed top surfaces of plate 422. After this depositing, a patterned photoresist mask may be formed over the IDT conductor material at locations or areas where the IDTs will be formed. The photoresist mask may be blanket deposited over the IDT conductor material and then patterned using photolithography to define the conductor pattern at locations where the mask exists after patterning. The patterned photoresist mask may function like an etch stop in that it will be impervious to (and/or be etched magnitudes slower than the conductor material by) the processes and chemicals used to etch the conductor material. Suitable photoresist materials may include a light-sensitive organic material (e.g., a photopolymeric, photodecomposing, or photocrosslinking photoresist).

After the mask is patterned, the IDT conductor material is etched, such as by being dry etched, and removed where it is not protected by the photoresist mask, thus forming the IDT conductor patterns. The conductor layer can be etched, for example, by an anisotropic plasma etching, reactive ion etching, wet chemical etching, and other etching techniques. The etch etches or removes the conductor over and to the plate 422 over resonators 402 and 404. Both, plate 422 may be impervious to (or be etched magnitudes slower by) the processes and chemicals used to etch the conductors. After this etch, the photoresist mask is removed from the top surface of the conductor material to leave the pattern of desired conductor material for the IDTs. The remaining desired conductor material include the IDT conductor, including fingers 436 and 438.

In another case, IDTs may be formed at 730 using a lift-off process. Photoresist may be deposited over the piezoelectric plate 422 and patterned to define the conductor pattern. The conductor layer may be deposited in sequence over the surface of the piezoelectric plate. The photoresist may then be removed, which removes the excess material, leaving the conductor pattern with fingers 436 and 438.

At 740, a dielectric layer 424 is formed on the planarized surface of piezoelectric plate 422 and over the IDTs, including fingers 436 and 438. Forming at 740 may be coating a piezoelectric plate interface with a dielectric layer that is 100-300 nm thick and that can act as a bonding layer for subsequent bonding of a second piezoelectric plate 426 to plate 422. The dielectric layer has or can be planarized to have thickness td and is a material described for layer 424. The dielectric layer may be Al2O3 or SiO2. In some cases, it is any material suitable for molecular bonding to the plate 422 material and to the plate 426 material. Forming at 740 may include blanket depositing the dielectring material over all of the exposed top surfaces of the plate 422 and IDTs using atomic layer deposition (ALD) to form the dielectric layer. The metal fingers 436 and 438 are completely covered by dielectric 424 and may be polished to a smooth surface for easy bonding of layer 424 with the top piezoelectric plate 426.

In some cases, dielectric layer 424 is formed on the planarized surface of piezoelectric plate 422 before forming the IDTs (not shown), including fingers 436 and 438. In this case, dielectric layer 424 is formed such as by blanket deposition, and planarized if necessary. Then, openings are etched in the layer 424 where the IDTs are to be formed. This may be done by patterning and etching, such as using plate 422 as an etch stop. Then, the IDTs are formed by depositing the conductor material into the openings in the layer 424. This may be done by blanked deposition or plating of the conductor material into the openings and onto patterned layer 424; and then planarizing the top surface of the conductor material to layer 424. At this point, an additional thickness of layer 424 is added over the IDTs to provided better bonding of plate 422 and 426 as noted herein.

At 750, second piezoelectric plate 426 is bonded to dielectric layer 424. Bonding at 750 may be bonding a piezoelectric wafer to a top surface of layer 424 using dielectric layer 424 as a bonding layer. This bonding may represent or be any of the processes for forming a piezoelectric plate noted at 620. Second piezoelectric plate 426 may be a material as noted for any of the plates herein. The bonding of plate 426 to the dielectric layer 424 may be as described for bonding any of the plates and dielectric layers as noted herein. The second piezoelectric plate 426 layer may be bonded using a direct-bond process to the bonding layer 424.

The crystal-cut orientation of piezoelectric plates 422 and 426 may be different to so that they bond better, couple better and perform better as a dual-wafer (e.g., two piezoelectric plates bonded to together) stack than if they had the same orientation. The difference in crystal-cut orientation of piezoelectric plates 422 and 426 can be selected for a predetermined performance or tuning of shunt resonators which require thicker piezoelectric dual-wafer plate to operate at lower frequency than the series resonators.

Bonding at 750, may include planarizing second piezoelectric plate 426 to have thickness tp2. Planarizing at 750 may be accurately thinning the thickness of a piezoelectric wafer to a final thickness of tp2. At 750, the exposed surface of second piezoelectric plate 426 may be polished or planarized such as using chemical mechanical processing (CMP) from a thickness greater than thickness tp2, down to thickness tp2 as shown at 750.

At 760, a top dielectric layer 417 is formed on the surface of second piezoelectric plate 426. Forming at 760 may be coating piezoelectric plate 426 top surface with a dielectric layer that is 50-200 nm thick and then palanrizing that layer to selected thickness tds to tune shunt XBAR resonator 402. The dielectric layer may be Al2O3 or SiO2. The dielectric layer has or can be planarized to have thickness td and is a material described for layer 426. In some cases, it is any material suitable for molecular bonding to the plate 426 and acting as a top dielectric for tuning a shunt sandwich XBAR resonator. Forming at 760 may include blanket depositing the dielectric material over all of the exposed top surfaces of the plate 426 using atomic layer deposition (ALD) to form the dielectric layer.

At 770, one or more portions of dielectric layer 417 are etched and removed to form resonators 404 where the layer is etched. Etching at 770 may be patterning a wafer having the substrate, and layers 422, 424, 426 and 417 to expose areas at locations of the series resonators 404; then, selectively etching layer 417 from and to the top of the plate 426 over the higher-frequency series resonator 404, while leaving layer 418 over the lower-frequency shunt resonator 402. Etching at 770 may be patterning and etching to: remove thickness tds of layer 417 at an area above a cavity of resonator 404; and to leave thickness tds of layer plate 418 at an area above a cavity of resonator 402. During the etch, plate 426 may function as an etch stop layer. This etching may represent or be any of the processes for removing portions of layer 418 to form resonators 404 as noted herein.

Etching at 770 may include forming a patterned mask layer over the layer 417 at areas where resonators 402 will be formed. The patterned mask may function like an etch stop in that it will be impervious to and/or etch magnitudes slower than the layer 417 by the processes and chemicals used to etch that dielectric. Suitable mask layers may include photoresist materials such as a light sensitive material, a light-sensitive organic material (e.g., a photopolymeric, photodecomposing, or photocrosslinking photoresist), or an oxide or a nitride hard mask.

After the mask is patterned, the material of layer 417 is etched, and removed where it is not protected by the mask, thus forming the thinned layer 418. The layer 417 can be etched, for example, by an anisotropic plasma etching, reactive ion etching, wet chemical etching, and/or other etching technique. Plate 426 may be impervious to or be etched magnitudes slower by the processes and chemicals used to etch layer 417. After this etch, the photoresist mask is removed from the top surface of layer 418 to leave the pattern of desired resonator 402. What remains on the wafer includes resonators 402 and 404 as shown.

After etching at 770, process 700 may return to forming dielectric layers at 640, such as if a bottom dielectric or passivation layer is to be formed. After etching at 770, process 700 may return to 610B or 610C if not.

Using the bonding and etching process 700 enables shunt and series 15 GHz sandwiched XBAR resonators on the same die that are accurately formed. This avoids difficulties in fabricating a bandpass filter at 15 GHz because: the size of all the structures of resonators 402 and 404 are large enough to not make it difficult to fabricate and control; the high coupling of the resonators does not reduce input to output energy transfer; and spurious modes do not interfere with desired signal output. The frequency of the third mode of the sandwiched XBAR resonators is increased to 15 GHz while coupling is considerably low (i.e., much lower keff^2 compared to the primary mode) and spurious mode is controlled. These shunt and series 15 GHz sandwiched XBAR resonators can be used to design a 15 GHz bandpass filter.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, the pair of terms "top" and "bottom" can be interchanged with the pair "front" and "back". As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

The invention claimed is:

1. A filter device comprising:
   a substrate having at least a first cavity and a second cavity on a single die comprised of a plurality of layers;
   a first piezoelectric plate spanning the first cavity and the second cavity;
   a first interdigital transducer (IDT) on a front surface of the first piezoelectric plate that is opposite the substrate, the first IDT having interleaved fingers over the first cavity;
   a second IDT on the front surface of the first piezoelectric plate and having interleaved fingers over the second cavity;

a first dielectric layer on the first piezoelectric plate, covering the first IDT and covering the second IDT;
a second piezoelectric plate on a surface of the first dielectric layer, over the first cavity and over the second cavity, such that the first and second IDTs are sandwiched between the first and second piezoelectric plates; and
a second dielectric layer on a front surface of the second piezoelectric plate opposite the first dielectric layer and over the first cavity but not over the second cavity,
wherein the second dielectric layer is coupled to the front surface of the second piezoelectric plate without any electrodes therebetween.

2. The device of claim 1, wherein:
a first resonator of the filter device has the first piezoelectric plate, the first IDT, the first dielectric layer, the second piezoelectric plate, and the second dielectric layer; and
a second resonator of the filter device has the first piezoelectric plate, the second IDT, the dielectric layer, and the second piezoelectric plate.

3. The device of claim 2, wherein a thickness of the second dielectric layer is selected to tune the third harmonic shear mode in the first resonator.

4. The device of claim 2, further comprising connections between the first and second IDT that form an RF filter input and output.

5. The device of claim 1, wherein the first and second piezoelectric plates are both either lithium niobate or lithium tantalate.

6. The device of claim 5, wherein the first piezoelectric plate and the second piezoelectric plate have a same thickness.

7. The device of claim 1, wherein each of the first and second dielectric layer is one of Al2O3 or SiO2; and wherein the first piezoelectric plate and the second piezoelectric plate have a same thickness.

8. The device of claim 1, wherein the first dielectric layer is a bonding layer that bonds the first piezoelectric plate to the second piezoelectric plate.

9. The device of claim 1, wherein respective radio frequency signals applied to the first and second IDTs excite respective third harmonic shear mode in the first and second piezoelectric plates over the first and second cavities.

10. An acoustic resonator comprising:
a back surface of a first piezoelectric plate bonded to a top surface of a substrate comprised of a plurality of layers and having at least a first cavity;
a planarized top surface of the first piezoelectric plate forming a first thickness of the first piezoelectric plate with the back surface of the first piezoelectric plate;
the first piezoelectric plate spanning the first cavity;
a first interdigital transducer (IDT) on a front surface of the first piezoelectric plate that is opposite the substrate and having interleaved fingers over the first cavity;
a first dielectric layer on a top surface of the first piezoelectric plate and covering the first IDT;
a back surface of a second piezoelectric plate bonded to a top surface of the first dielectric layer that is opposite the first piezoelectric plate; and
a second dielectric layer coupled to a top surface of the second piezoelectric plate that is opposite the back surface without any electrodes therebetween,
wherein the second piezoelectric plate spans the first cavity.

11. The resonator of claim 10, wherein respective radio frequency signals applied to the first and second IDTs excite respective third harmonic shear mode in the first and second piezoelectric plates.

12. The resonator of claim 11, wherein the thickness of the first and second piezoelectric plates are selected to tune the third harmonic shear mode.

13. The resonator of claim 10, wherein
the first piezoelectric plate and the second piezoelectric plate have a same thickness; and
the first and second piezoelectric plates are both either lithium niobate or lithium tantalate.

14. The resonator of claim 10, wherein
the first and second dielectric first and second layers are each one of Al2O3 or SiO2; and
the first dielectric layer is a bonding layer for bonding the first to the second piezoelectric plate.

15. An acoustic filter device comprising:
a plurality of acoustic resonators connected in a ladder filter circuit, each acoustic resonator comprising:
a first single-crystal piezoelectric membrane;
a first dielectric layer on a surface of the first single-crystal piezoelectric membrane;
an interdigital transducer (IDT) embedded in the first dielectric layer;
a second single-crystal piezoelectric membrane bonded to the first dielectric layer; and
a second dielectric layer on a surface of the second single-crystal piezoelectric membrane that is opposite the IDT without any electrodes between the second dielectric layer and the second single-crystal piezoelectric membrane.

16. The device of claim 15, wherein the second dielectric layer forms a portion of a shunt resonator subset of the plurality of acoustic resonators but not a series resonator subset of the plurality of acoustic resonators.

17. The device of claim 16, wherein the shunt and series resonator subsets are configured such that respective radio frequency signals applied IDTs of the shunt and series resonator excite respective third harmonic shear modes in the shunt and series resonators.

18. The device of claim 17, wherein the thickness of the dielectric layer, the first piezoelectric plate and the second piezoelectric plate are selected to tune the respective third harmonic shear modes of the shunt and series resonators.

19. The device of claim 16, wherein the first piezoelectric plate and the second piezoelectric plate have a same thickness.

20. The device of claim 16, wherein each of the first and second dielectric layers are one of Al2O3 or SiO2; and wherein the first dielectric layer is a bonding layer bonding the first to the second piezoelectric plate.

* * * * *